(12) United States Patent
Zhu et al.

(10) Patent No.: US 6,391,483 B1
(45) Date of Patent: May 21, 2002

(54) MAGNETIC DEVICE AND METHOD OF FORMING SAME

(75) Inventors: Jian-Gang Zhu; Youfeng Zheng, both of Pittsburgh, PA (US); Gary A. Prinz, Alexandria, VA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 09/281,171

(22) Filed: Mar. 30, 1999

(51) Int. Cl.[7] ................................................. G11B 5/66
(52) U.S. Cl. ............................ 428/692; 428/694 TM; 428/900; 365/98; 365/129; 360/113; 338/32 R; 324/207.21; 324/252
(58) Field of Search .................... 428/692, 694 TM, 428/900; 324/207.21, 252; 338/32 R; 360/113; 365/129, 98

(56) References Cited

U.S. PATENT DOCUMENTS

| | | | |
|---|---|---|---|
| 5,343,422 A | 8/1994 | Kung et al. ................. 365/173 |
| 5,475,304 A | 12/1995 | Prinz ...................... 324/207.21 |
| 5,477,482 A | 12/1995 | Prinz ......................... 365/129 |
| 5,541,868 A | 7/1996 | Prinz ........................... 365/98 |
| 5,640,343 A | 6/1997 | Gallagher et al. ........... 365/171 |
| 5,661,062 A | 8/1997 | Prinz ............................. 438/3 |
| 5,729,410 A | 3/1998 | Fontana, Jr. et al. ..... 360/324.2 |
| 5,734,605 A | 3/1998 | Zhu et al. .................... 365/173 |
| 5,745,408 A | 4/1998 | Chen et al. .................. 365/173 |
| 5,748,524 A | 5/1998 | Chen et al. .................. 365/173 |
| 5,757,695 A | 5/1998 | Shi et al. ..................... 365/158 |
| 5,768,183 A | 6/1998 | Zhu et al. .................... 365/171 |
| 5,774,394 A | 6/1998 | Chen et al. .................. 365/158 |
| 5,793,697 A | 8/1998 | Scheuerlein ........... 365/230.07 |
| 5,923,583 A | 7/1999 | Womack ..................... 365/171 |
| 5,969,978 A | 10/1999 | Prinz ............................ 365/98 |

FOREIGN PATENT DOCUMENTS

| | | |
|---|---|---|
| EP | 0 681 338 | 11/1998 |
| EP | 0 910 092 | 4/1999 |
| WO | WO 98/15897 | 4/1998 |
| WO | WO 98/44481 | 10/1998 |

OTHER PUBLICATIONS

Zhu et al, Characteristics of AP Bias in Spin Valve Memory Elements, Jul. 1998, IEEE Transactions on Magnetics, vol. 34, No. 4 pp. 1063–1065.

*Primary Examiner*—Leszek Kiliman
(74) *Attorney, Agent, or Firm*—Kirkpatrick & Lockhart LLP

(57) ABSTRACT

A device including a magnetic material having a magnetization configuration that is circular in a plane, and a word line for producing a magnetic field in the plane, the magnetic field being radial with respect to a point in the plane and within the circular magnetization configuration.

51 Claims, 25 Drawing Sheets high resistance          low resistance

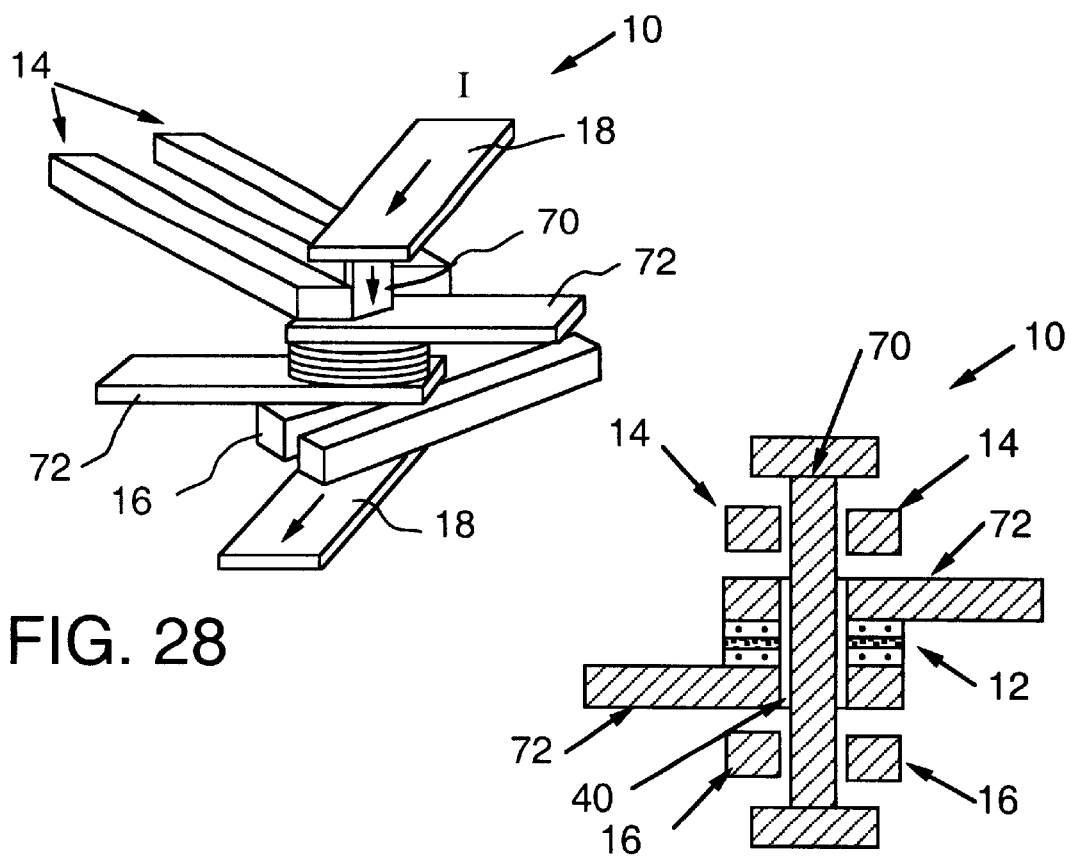
FIG. 28
FIG. 29
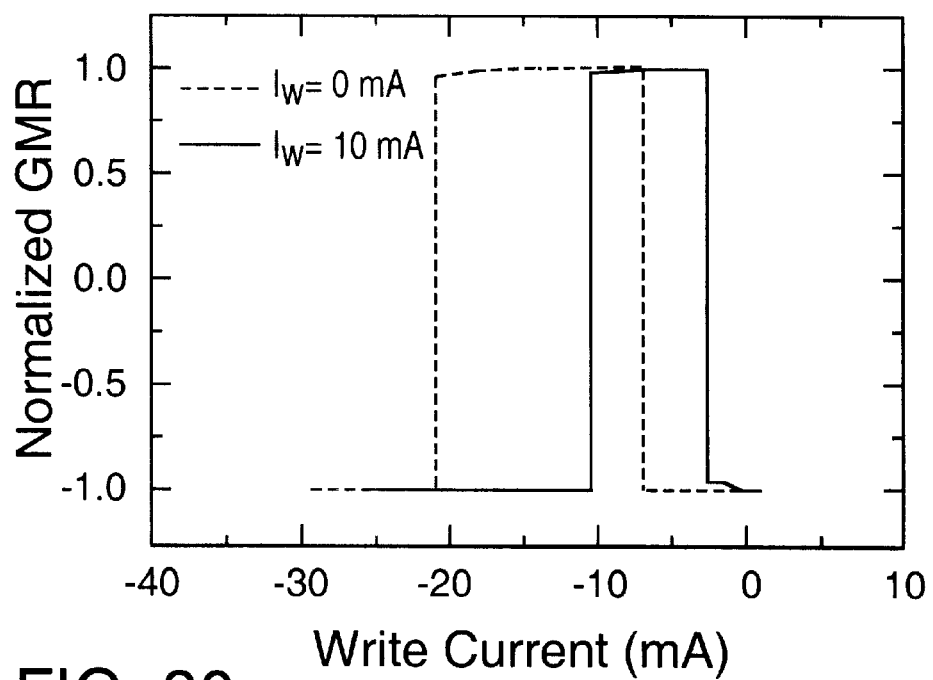
FIG. 30

MAGNETIC DEVICE AND METHOD OF FORMING SAME

STATEMENT REGARDING FEDERALLY SPONSORED RESEARCH OR DEVELOPMENT

This invention was made with government support under contract No. 0014-97-1-0691, awarded by the Naval Research Lab/ONR. The government has certain rights in this invention.

CROSS REFERENCE TO RELATED APPLICATIONS

Not Applicable.

BACKGROUND OF THE INVENTION

1. Field of the Invention

The present invention is directed generally to a magnetic device and, more particularly, to a magnetic device that may be used for memory and logic circuits, and a method of forming such a device.

2. Description of the Background

Magnetic devices, such as magnetic memory devices, can be generally divided into two types of operation modes in terms of magnetization configurations in the device. Those types are linear and circular.

In linear devices, magnetization in a magnetic element is essentially linearly aligned. Examples of such devices include spin valve devices, pseudo-spin valve devices, and synthetic anti-ferromagnetic biased magnetic tunneling junction devices. One problem with linear operation is that the magnetization is discontinuous at the ends of the element. The ends introduce many kinds of end domains, yield variations in the switching processes, and yield variations of the switching field. As a result, linear devices are often unreliable in their operation.

Circular devices are typically solid circles (discs) or annular shaped elements (rings). The circular geometry results in a circular magnetization configuration and, therefore, the end domains are eliminated. The circular domain configurations are well defined and stable. In conventional thought, a circular magnetization configuration can be reversed with a circular magnetic field with an opposite polarity. In practice, however, using a circular magnetic field to reverse the polarity of the magnetization circulation in a circular magnetic device often generates incomplete reversal, leaving residual magnetic domains in the device.

Therefore, the need exists for a magnetic device that does not suffer from unreliability problems associated with linear devices, and one in which the state can be reliably changed without incomplete reversals typically associated with circular devices.

BRIEF SUMMARY OF THE INVENTION

The present invention is directed to a device including a magnetic material having a magnetization configuration that is circular in a plane, and a word line for producing a magnetic field in the plane, the magnetic field being radial with respect to a point in the plane and within the circular magnetization configuration. The device may be, for example, a memory device or a logic device, such as a transistor.

The present invention solves problems experienced with the prior art because it provides for a well defined and stable state, and its state can be easily and completely changed when so desired. In addition, when embodied as a memory device, it does not need to be refreshed (unlike DRAM) and it requires very low current (unlike SRAM). When embodied as a logic circuit, the present invention does not require input signals to be maintained in order maintain the proper output signal. Those and other advantages and benefits of the present invention will become apparent from the description of the preferred embodiments hereinbelow.

BRIEF DESCRIPTION OF THE SEVERAL VIEWS OF THE DRAWING

For the present invention to be clearly understood and readily practiced, the present invention will be described in conjunction with the following figures, wherein:

FIG. 28 is a perspective view of a magnetic tunneling junction memory device according to the present invention;

FIG. 29 is a cross-sectional view of the memory device of FIG. 28;

FIG. 30 is a graph illustrating resistance versus bit line current at several word line current magnitudes for switching the memory device of FIG. 28;

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements. Those of ordinary skill in the art will recognize that other elements may be desirable. However, because such elements are known in the art, and because they do not facilitate a better understanding of the present invention, a discussion of such elements is not provided herein. Most of the discussion of the present invention will focus on the use of the present invention as a memory device, although the present invention has other applications, such as logic devices.

Advantages of the present invention may be realized with a number of structures and technologies, such as doped silicon substrate, silicon-on-insulator, silicon-on-sapphire, and thin film. The term "substrate", as used herein, refers to a structure that is often the lowest layer of semiconductor material in a wafer or die. In some technologies, however, the substrate is not a semiconductor material and may be, for example, an insulator. A substrate will often include one or more layers or structures formed thereon and/or therein. The substrate will often also include one or more active or operable portions of a device.

Figure 1:
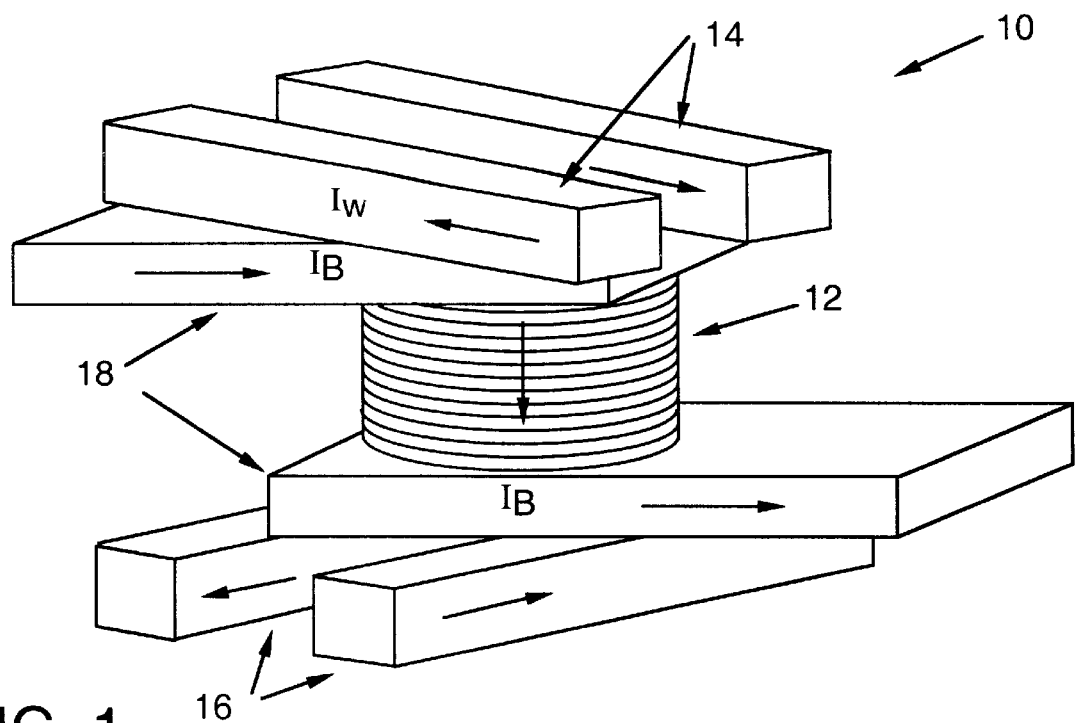
FIG. 1 is a perspective view of a memory device according to the present invention.

FIG. 1 is a perspective view of one embodiment of a memory device 10 according to the present invention. The present invention provides for a well-defined, stable, circular magnetization configuration and for reliable reversal of the magnetization configuration. The memory device 10 is a circular domain magnetic memory device and includes a memory element 12, first and second pairs of wordlines 14, 16, and a bit line 18. The memory element 12 is an example of a current-perpendicular-to-plane device ("CPP"), because current through the bit line 18 flows perpendicular to the planes in which the magnetization exist in the memory element 12. As a result, the current through the bit line 18 can control the magnetization configuration in the memory element 12.

The memory element 12 may be a multilayer stack of magnetic rings or disks. The memory element 12 exhibits a magneto-resistive effect that varies with the relative polarities of the magnetization configuration in the rings or disks in the stack. The memory element 12 is discussed in more detail hereinbelow with respect to FIG. 3.

The word line pairs 14, 16, or "paired word lines", generate a magnetic field that affects the memory element 12 and is used for both writing to and reading from the memory element 12. In the illustrated embodiment, wordline pairs 14, 16 are orthogonal to each other, with the first wordline pair 14 being above the memory element 12 and the second wordline pair being below the memory element 12. Current in the wordlines forming the word line pairs 14, 16 flows in opposite directions, as indicated by arrows on the wordlines. The wordlines 14, 16 may have widths and thicknesses that are the smallest feature size of the fabrication process. The wordlines may be made of a metal such as aluminum or copper. Less than two pair of wordlines 14, 16 may be used. For example, as described hereinbelow, two wordlines, one above and one below the memory element 12 may be used. Also, in certain circumstances, a single wordline may be used.

Figure 25:
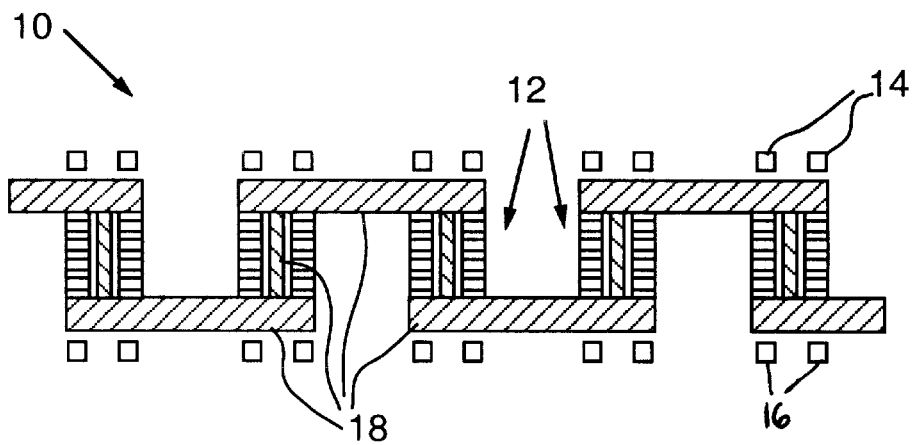
FIG. 25 is a cross-sectional view of the memory device of FIG. 23.
Figure 26:
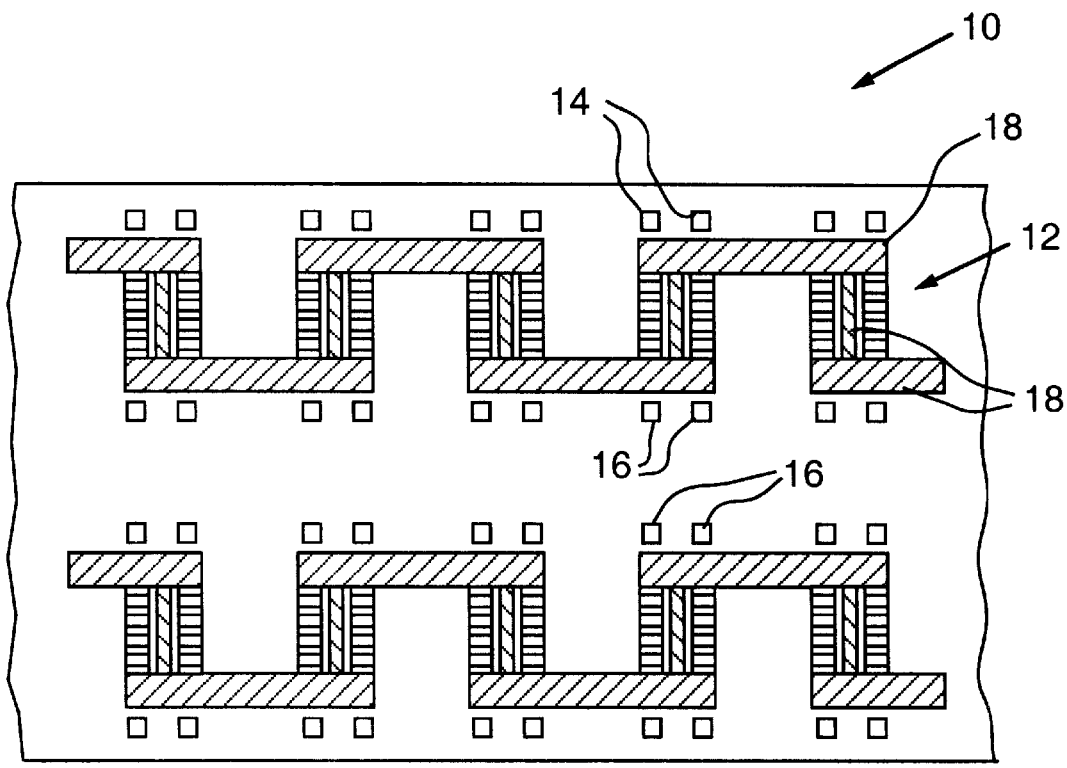
FIG. 26 is a cross-sectional view of a stacked memory device.

The bit line 18 carries current through one or more memory elements 12. In the described embodiment, the bit line 18 may be used for both writing to and reading from the memory element 12. Current may flow through the bit line 18 in either direction. The bit line 18 may be made to the same dimensions and of the same materials as the wordlines 14, 16. The bit line 18 may be embodied as separate lines, as described hereinbelow with respect to FIGS. 28–30. For example, one line may pass through holes in the layers forming the memory element 12 and be electrically insulated therefrom, and another line may be electrically connected to the layers forming the memory element 12. In that example, the first line may be used to induce a circular magnetic field on the memory element 12, and the second line used to measure a change in resistance of the memory element 12, as described in more detail hereinbelow. In the illustrated embodiment, the bit line 18 includes a line through holes in the layers forming the memory element 12 and electrically insulated therefrom, and is also electrically connected to the layers forming the memory element 12. In that embodiment, the line through the hole and the layers forming the memory element are electrically connected in parallel, sharing common points at each end of the memory element 12 (as illustrated in FIGS. 25 and 26).

Figure 2:
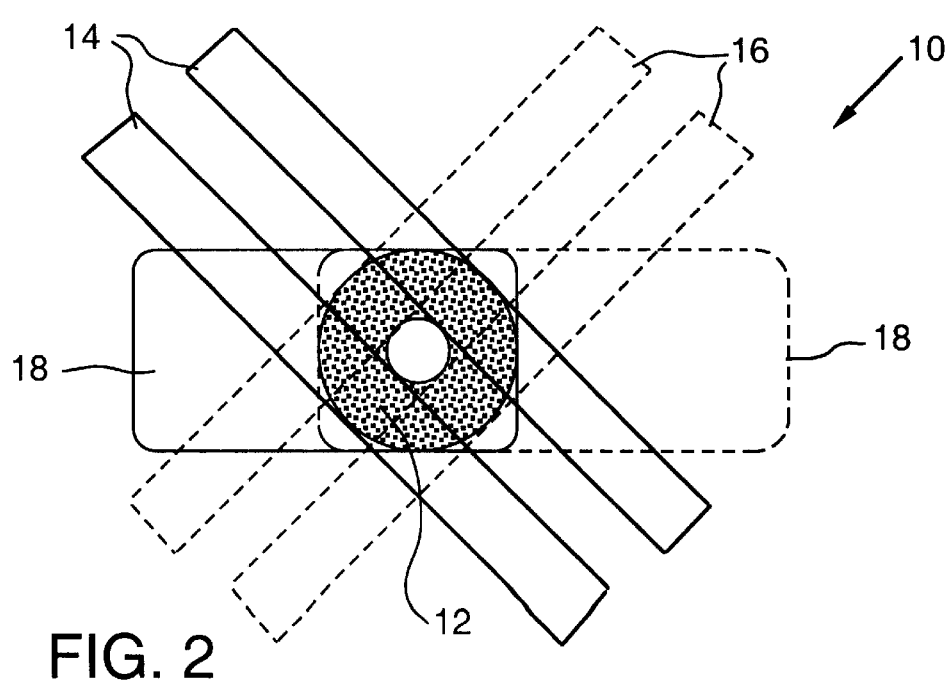
FIG. 2 is a top plan view of the memory device in FIG. 1.

FIG. 2 is a top plan view of the memory device 10 illustrated in FIG. 1 and more clearly shows the orthogonal orientation of the wordline pairs 14, 16.

Figure 3:
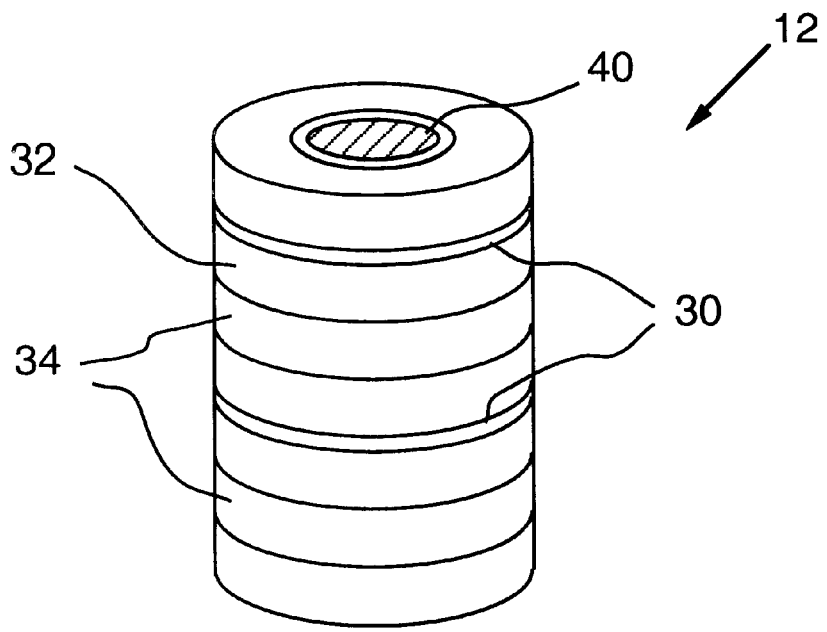
FIGS. 3 and 4 are perspective views of a memory element of the present invention.

FIG. 3 is a perspective view of one embodiment of the memory element 12. The memory element 12 may take many forms, as discussed hereinbelow. In the illustrated embodiment, the memory element 12 includes lower moment magnetic layers 30, conductive layers 32, and higher moment magnetic layers 34. That pattern of layers 30, 32, 34, may be repeated multiple times to form the memory element 12, as in the illustrated embodiment. The layers 30, 32, 34, may be, for example, CoFe (thickness of approximately 1.5 nm), Cu (thickness of approximately 4 nm), and CoFe (thickness of approximately 2.5 nm), respectively. Other materials may be used for the magnetic layers 30, 34, such as NiFeCo. The magnetic layers 30, 34 have a magnetic configuration (also called "magnetic orientation" and "magnetic circulation") which is the polarity or direction of magnetization in the layers 30, 34. Typically, the magnetization configuration is circular (e.g. clockwise or counterclockwise).

The higher moment magnetic layer 34 has a greater switching threshold and requires a higher switching field than does the lower moment magnetic layer 30. Thus, the stack consists of two sets of magnetic layers, a lower magnetic moment set, also referred to as a "soft magnetic layer set" or "soft set" because a lower magnetic field is needed to switch the layers' magnetization configuration; and a higher magnetic moment set, referred to as a "hard magnetic layer set" or "hard set" because a greater magnetic field is required to switch their magnetization configuration. In the illustrated embodiment, the hard and soft magnetic layers are made from the same materials but have different magnetic moments because of their different thicknesses. More specifically, the thicker a layer, the greater the magnetic moment and the greater the magnetic field (the switching field) required to switch it. In another embodiment, the hard and soft magnetic layers may be made of different materials having different magnetic properties so that layers in both the hard set and the soft set can have the same thickness. The non-magnetic, conductive layers 32 can be made thicker to further reduce interference between the magnetic layers 30, 34. In another embodiment, the conductive layers 32 may be replaced with insulating layers and the memory device 10 may be a magnetic tunneling junction (MTJ) device, as described in more detail hereinbelow with respect to FIGS. 28–30.

The resistance of the memory element 12 varies depending on the relative magnetic polarities of the magnetic layers 30, 34. That change in resistance is increased as more magnetic layers are added to the memory element 12. In the illustrated embodiment there are nine layers. When the magnetization circulation of all the magnetic layers 30, 34 is the same, the resistance of the memory element 12 is the lowest. When the magnetization circulation of the soft set and hard set are opposite, or anti-parallel, the resistance becomes the highest. Experiments have shown a change in resistance of approximately 100% between parallel and anti-parallel magnetization of the hard and soft sets. Data, a bit state of "1" or "0", is stored in the memory element 12 as the magnetization circulation direction of the hard layer set. As described in more detail hereinbelow, the soft layer set is not needed for storing data, but is used to interrogate the magnetization circulation direction of the hard layer set.

The layers 30, 32, 34 may be rings defining a hole. That hole may be the smallest feature size of the fabrication process. The width of the solid portion of the ring may also be of the smallest size. The bit line 18 may also have a width of the smallest feature size. If an insulating layer 40 is used, the hole in the layer may need to be greater than the minimum feature size to allow for both the bit line 18 and the insulating layer 40 within the hole.

The memory device 10 of the present invention has many embodiments, some of which are described hereinbelow. For example, the layers 30, 32, 34 are illustrated as being annular or ring-shaped, whereby the bit line 18 passes through the hole in the layers 30, 32, 34. In that embodiment, an insulating layer 40 may be between the bit line 18 and the layers forming the memory element 12. That insulating layer 40 may be, for example, $SiO_2$, SiN, or an oxide of the layers forming the memory element 12 or an oxide of the bit line 18.

Figure 4:
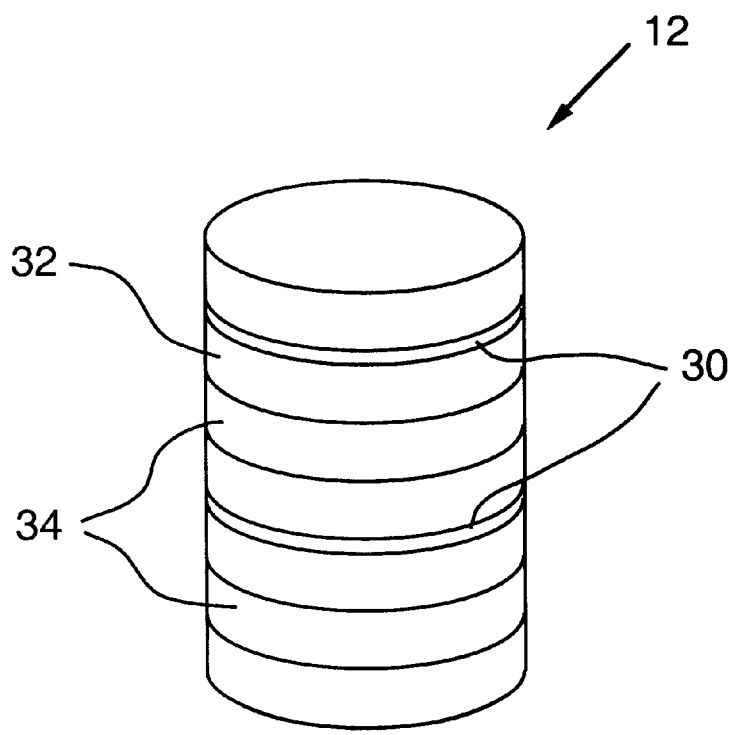

FIG. 4 is a perspective view of another embodiment of the present invention in which the layers 30, 32, 34 forming the memory element 12 are solid disks. It has been found that when the memory element 12 is formed from solid disks the magnetization configuration tends to be off-center of the disk. Such an off-center circular magnetization configuration is less stable and, therefore, typically less desirable than a centered circular magnetization configuration. In that embodiment the solid disks forming the memory element 12 may be considered as part of the bit line 18 because it carries current used to generate a circular magnetic field, as described hereinbelow.

Figure 5:
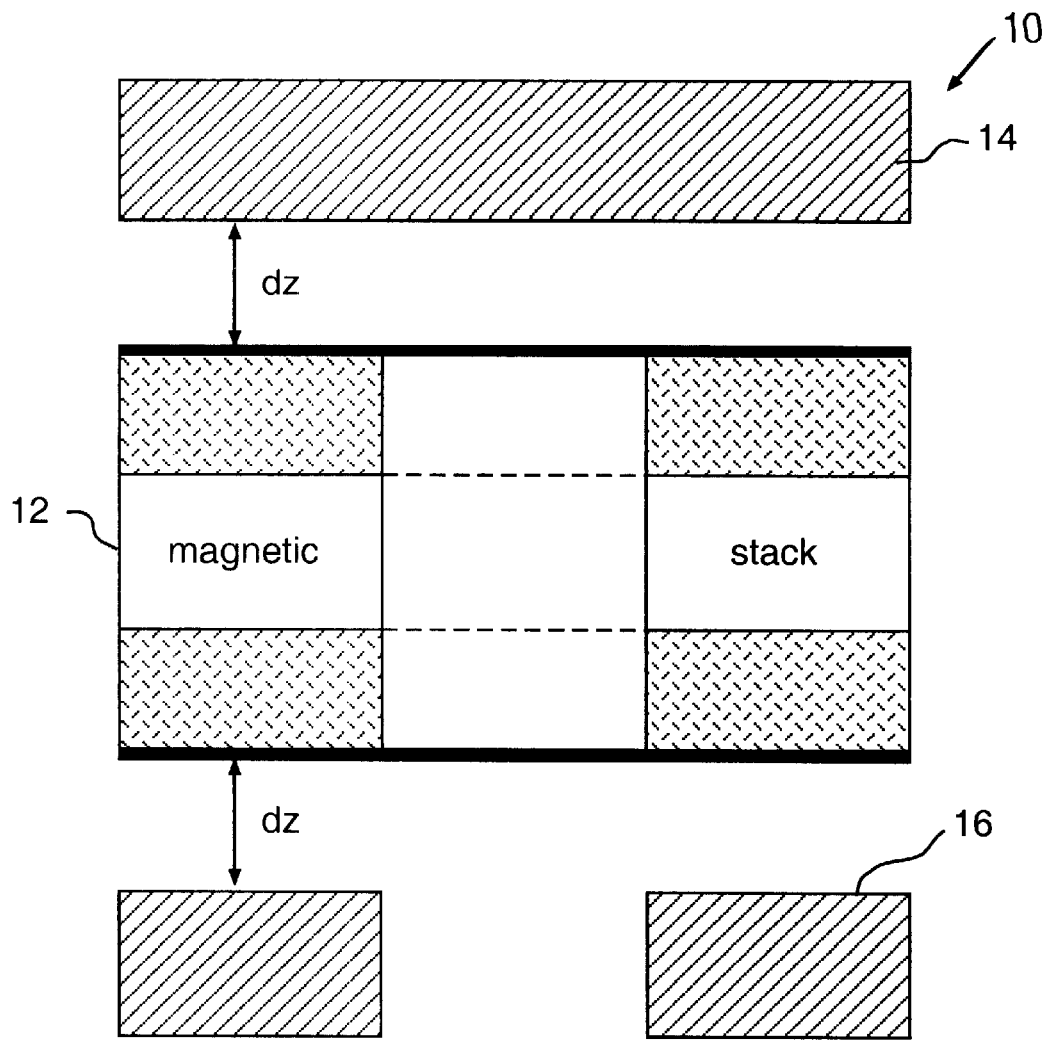
FIG. 5 is a cross-sectional view of a memory device according to the present invention.

FIG. 5 is a cross-sectional view of the memory device 10 illustrated in FIG. 1. Current flowing through the word line pairs 14, 16 generates an outward radial magnetic field (or an inward magnetic field if the current directions are reversed) around the memory element 12. If the paired word lines 14, 16 are centered with the memory element 12 and each word line is approximately the same size and carries approximately the same current, the radial magnetic field produced is approximately uniform around the memory element 12.

Figure 6:
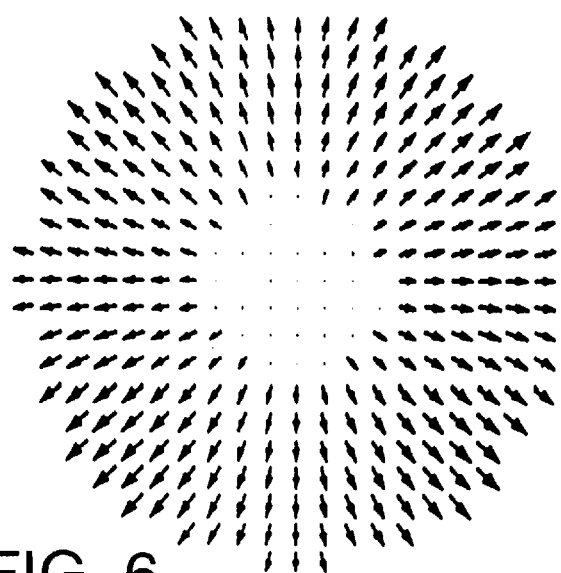
FIG. 6 is a magnetic field vector diagram of a radial magnetic field generated by the word line current in the memory device.

FIG. 6 is a magnetic vector diagram illustrating the magnetic field produced by the wordline pairs 14, 16 when measured in a plane parallel to the wordline pairs 14, 16 and at about the midpoint between the wordline pairs 14, 16. The radial magnetic field produced by the wordline pairs 14, 16 facilitates changing the polarity of the magnetic layers in the memory element 12 by creating a state in the memory element 12 wherein a relatively small, circular magnetic field (as generated by current through bit line 18) will produce reliable and repeatable switching of the polarity of the memory element 12. More specifically, the word line 14, 16 current field "guides" the switching and the actual switching is driven by the bit line 18 current field. The combination of the word line 14, 16 current field and the bit line 18 current field provides for reliable switching. As a result, the direction of the magnetization configuration in one or both of the hard and soft sets in the memory element 12 can be more easily and more reliably changed, such as with the bit line 18 current field. The direction of current in the bit line 18, and the resultant direction of the magnetic field generated thereby, determines whether the affected hard and/or soft sets take on a clockwise magnetization configuration or a counterclockwise magnetization configuration.

Figure 7:
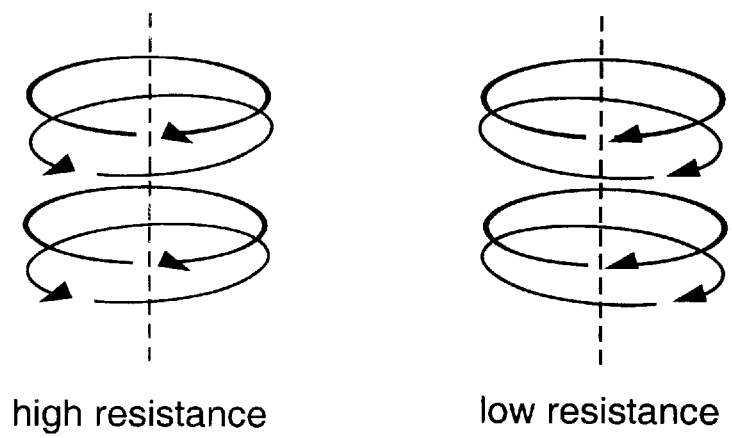
FIG. 7 illustrates parallel and anti-parallel magnetization configuration.

FIG. 7 illustrates different relative circular magnetization configurations of the hard and soft layers and the resultant resistance. The magnetization configurations are centered about an imaginary line that is normal to the magnetization configuration. That imaginary line may also define a portion of the bit line 18 that is used to set the magnetization configurations of the memory element 12. The magnetization configuration on the left illustrates an anti-parallel circular magnetization configuration, resulting in a high resistance. The configuration on the right illustrates a parallel circular magnetization configuration, resulting in a low resistance.

Figure 8:
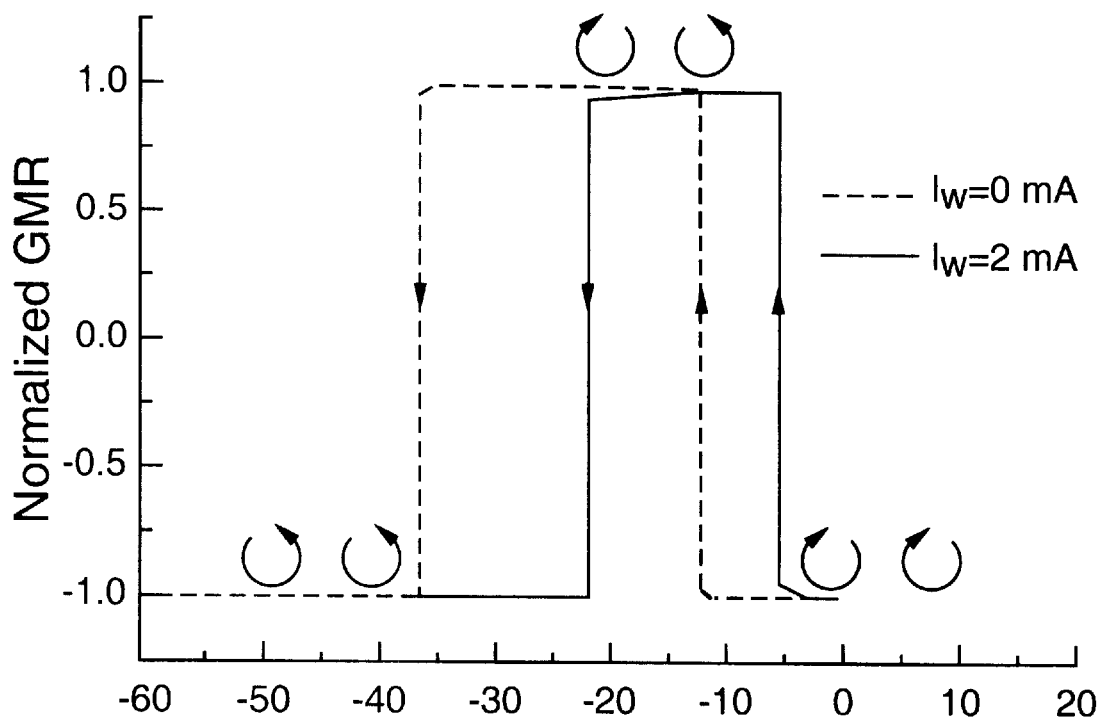
FIG. 8 is a graph illustrating resistance versus bit line current when switching hard and soft sets in the memory device.

FIG. 8 is a graph illustrating normalized giant magneto-resistance (GMR) through the memory element 12 versus bit line 18 current through the memory element 12. The normalized GMR was measured through the bit line 18 wherein the memory element 12 has a first magnetic layer (soft set) of NiFeCo (thickness of approximately 10 Å), conductive layers of Cu (thickness of approximately 40 Å), and a second magnetic layer (hard set) of NiFeCo (thickness of approximately 20 Å). The layers are arranged in a repeating pattern analogous to that shown in FIG. 3. The graph illustrates the switching behavior of the memory element 12 and, in particular, the resistance output as a function of bit line 18 current field for two cases: (1) with current flowing through the word line pairs 14, 16, and (2) without current flowing through the word line pairs 14, 16. In other words, the graph illustrates the resistance encountered by varying bit line 18 currents, with the broken line representing a situation when no current is flowing through the word line pairs 14, 16, and the solid line representing a situation when a word line current of 2 mA is flowing through each line of the word line pairs 14, 16. The bit line 18 current is illustrated in the graph as being negative to indicate that it is flowing in the opposite direction of the arrow indicating to bit line 18 current in FIG. 1.

In general, the graph represents the following. At zero bit line 18 current (and therefore zero bit line 18 magnetic field) the memory element 12 is in a state with both the hard and soft layer sets magnetized in the same circular direction, for example both with clockwise magnetization. When current flows through the bit line 18, it does so in a direction such that the circular magnetic field it produces inside the memory element 12 is opposing the initial magnetization direction of the memory element 12. As the current through the bit line 18 increases in magnitude, the soft layer set reverses its magnetization direction first, forming an anti-parallel magnetization orientation between the soft layers and hard layers and, hence, a high resistance state. Further increasing the magnitude of the current through the bit line 18 will yield the switching of the hard layers, thereby reducing the resistance.

More particularly, the hard and soft sets have the same, or parallel, polarity when the bit line current is zero, thereby resulting in a low normalized GMR. As the magnitude of the bit line 18 current increases, there is a sudden increase in normalized GMR, indicating that the polarity of the soft set has flipped. As a result, the hard and soft sets are now of opposite polarity, resulting in a higher resistance. That increase in normalized GMR occurs sooner when current is flowing through the word line pairs 14, 16 because the radial magnetic field created by the current through the word line pairs 14, 16 makes it easier to change the polarity of magnetic layers in the memory element 12. Regardless of current flowing through the word line pairs 14, 16, the soft set changes polarity sooner than the hard set because it has a lower magnetic moment (in the illustrated embodiment, that is because the soft set is made from layers that are thinner than the layers forming the hard set). As the magnitude of the current through the bit line 18 continues to increase, the normalized GMR suddenly decreases indicating that the hard set has changed polarity and, as a result, both the hard set and the soft set now have the same polarity. The common polarity between the hard and soft sets results in a lower normalized GMR. The decrease in normalized GMR occurs sooner when current is flowing through the word line pairs 14, 16 because, as mentioned above, the radial magnetic field facilitates changing the polarity of the layers in the memory element 12.

In the illustrated example, when current flows through the word lines 14, 16, the hard layer set switches at about half of the bit line 18 current needed when there is no current flowing through the word lines 14, 16. The difference gives a margin of safety for memory elements 12 that share the bit line 18 but are not being addressed with the word lines 14, 16, as discussed in more detail hereinbelow.

Figure 9:
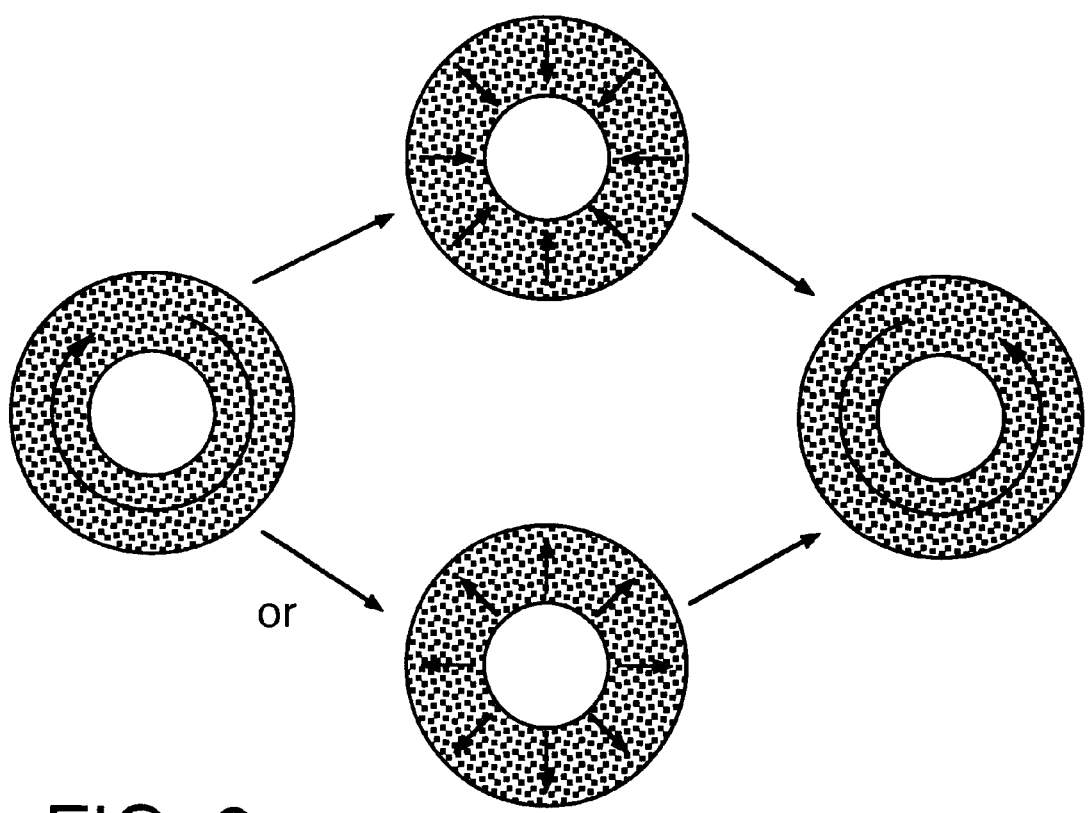
FIG. 9 is a schematic illustrating a switching operation.

FIG. 9 is a schematic illustrating magnetic configurations in magnetic layers, such as those that may be used to form the memory element 12, during a switching operation. The left-most layer is a magnetic layer having a clockwise magnetization configuration. The two center magnetic layers illustrate the influence of a radial magnetic field, such as may be induced by the wordlines 14, 16. The top of those center layers illustrates an inward radial magnetization configuration, and the bottom of those layers illustrates an outward radial magnetization configuration. Both an inward and outward magnetization configurations can be generated by the same wordline pairs 14, 16, by switching the direction in which the current flows through those wordline pairs 14, 16. The radial magnetic field induced in the magnetic layers makes the magnetic layers susceptible to being switched to a desired magnetic field, such as a counterclockwise magnetic field as illustrated in the right-most magnetic layer.

Figure 10:
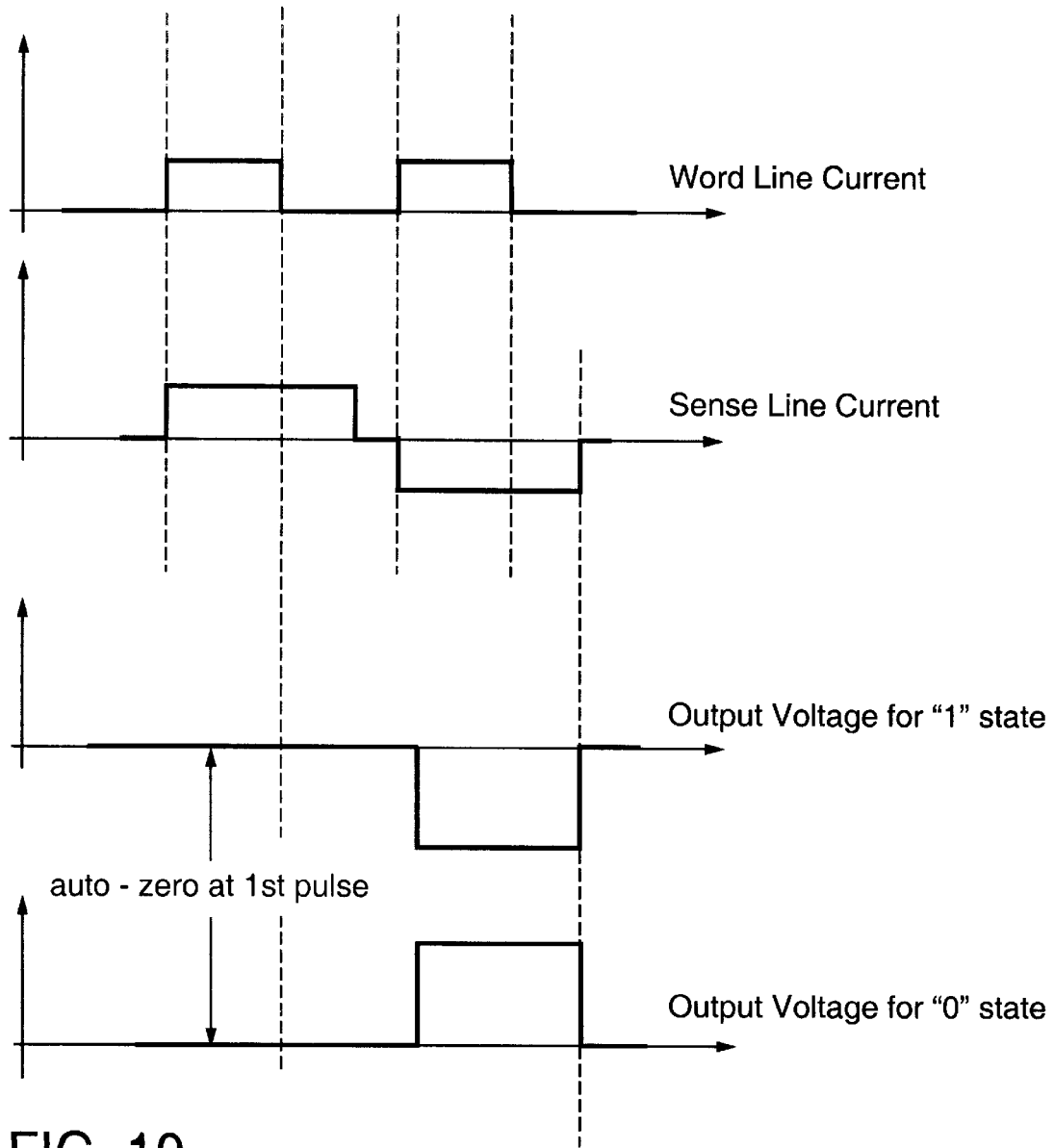
FIGS. 10, 11, and 12 are timing diagrams illustrating a read process.

FIG. 10 includes timing diagrams for a read operation according to the present invention. The first two timing diagrams illustrate current versus time for word line current and bit line current, respectively, and the last two timing diagrams illustrate voltage versus time for output voltage when reading a "1" state and output voltage for reading a "0" state, respectively. The output voltage may be measured from the bit line 18. That voltage is indicative of resistance through the memory element 12, which is indicative of the relative magnetization configuration of the hard and soft sets. Data, a bit state of "1" or "0", is stored in the memory element 12 as the magnetization circulation direction of the hard layer set. The soft layer set is used to interrogate the magnetization circulation direction of the hard layer set, and is not needed for storing the data.

Reading data from the memory element 12 may be accomplished by creating a radial magnetic field around the memory element 12, setting the soft set to a known magnetic orientation, measuring a first resistance through the memory element, setting the soft set to the opposite magnetic orientation, and measuring a second resistance through he memory element 12. One of the resistance measurements of the memory element 12 will be greater than the other. The value of the hard set can be determined from the resistance measurements because the resistance when the hard and soft sets are anti-parallel will be greater than when they are parallel and, therefore, the orientation of the hard set can be determined.

The read operation may be performed by providing low current through the word line pairs 14, 16 that address the selected memory element 12. That current produces a radial magnetic field around the memory element 12 and may be, for example, about ten to fifteen milliamps.

While current is flowing through the word line pairs 14, 16, a current is provided in a known direction through the bit line 18. The current through the bit line 18 and the current through the word line pairs should be low enough not to switch the magnetization of the hard layer set but high enough to switch the magnetization circulation of the soft layer set. Current may be allowed to continue to flow through the bit line 18 after the current through the word line pairs 14, 16 has stopped in order to eliminate the influence of the radial magnetic field on the final state of the soft set and to ensure that the soft set assumes the magnetization circulation induced by the bit line 18 current. As a result, the soft layer is set to a known state, for example a clockwise magnetization circulation.

The resistance of current flowing through the memory element 12 is measured after the soft set is in the first known state (e.g. clockwise magnetic circulation). That measurement may be performed by measuring the voltage across, or resistance through, the bit line 18.

After the first resistive measurement, current is again provided through the word line pairs 14, 16. While current is again flowing through the word line pairs 14, 16, current is provided in the opposite direction through the bit line 18 (e.g., to induce a counter-clockwise magnetic circulation in the soft set). Again, current may be allowed to continue to flow through the bit line 18 after the current through the word line pairs 14, 16 has stopped. The resistance of current flowing through the memory element 12 is again measured after the soft set is in the second, opposite state (e.g. counter-clockwise magnetic circulation).

The read method of the present invention dynamically reads the magnetization circulation direction of the hard set. That dynamic read aspect offers several advantages. One advantage is that the readout is non-destructive. In other words, the process of reading the state of the hard set does not change the state of the hard set. Another advantage is that the described read operation relies on the change in the resistance, not the value of the resistance itself. As a result, resistance variations of memory elements 12 along the bit line 18, as well as other variations in the memory device 10, such as temperature variations and fabrication variations, will not affect the validity of the read operation. Of course, the present invention may also be practiced by determining the state of the memory element by measuring the value of the resistance of the memory element 12, instead of the change in resistance, and thereby not measuring the resistance twice.

The output voltage diagrams illustrate an auto-zeroing technique that may be used with the present invention. Auto-zeroing involves defining the first measured voltage (indicative of the resistance when the soft set is in the first, known state) as zero, and then, when the soft set is in the second state, measuring the voltage relative to that defined "zero" of the first measurement.

Figure 11:
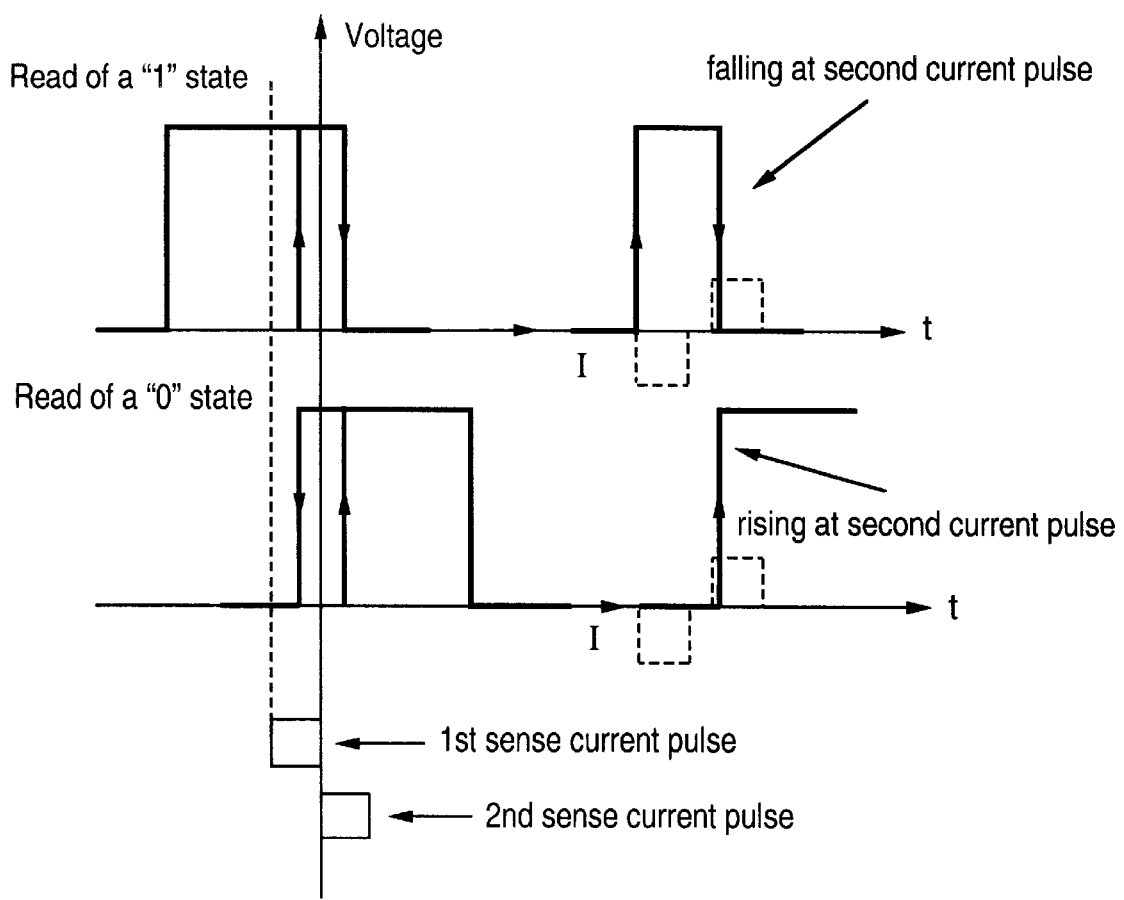

FIG. 11 is a graph illustrating voltage (indicative of resistance of the memory element 12) versus time and correlated with voltage pulses on the bit line 18. The top graph illustrates reading a "one" state and the lower graph illustrates reading a "zero" state. In both graphs, there is initially no voltage on the bit line 18. A negative voltage is then applied to the bit line 18. The voltage is of sufficient magnitude that it will change the circular magnetization configuration of the soft set (assuming that the circular magnetization configuration of the soft set is anti-parallel to the magnetic field generated by the current through the bit line 18), but will not change the circular magnetization configuration of the hard set. In the top graph, when the negative current is applied, the resistance of the memory element increases. In the bottom graph, when the negative current is applied, the resistance of the memory element 12 does not change. Thereafter, a second, positive current is applied to the bit line 18. In the top graph, the resistance of the memory element 12 decreases, indicating that the hard and soft sets now have a parallel magnetization configuration. In the bottom graph, the resistance of the memory element 12 increases, indicating that the hard and soft sets now have an anti-parallel magnetization configuration. Because the polarity of the currents applied on the bit line 18 are known, the magnetization configuration can be determined. Furthermore, as illustrated hereinabove, the read operation does not change the state of the hard set, so the integrity of the data is maintained and a refresh step is not needed.

Figure 12:
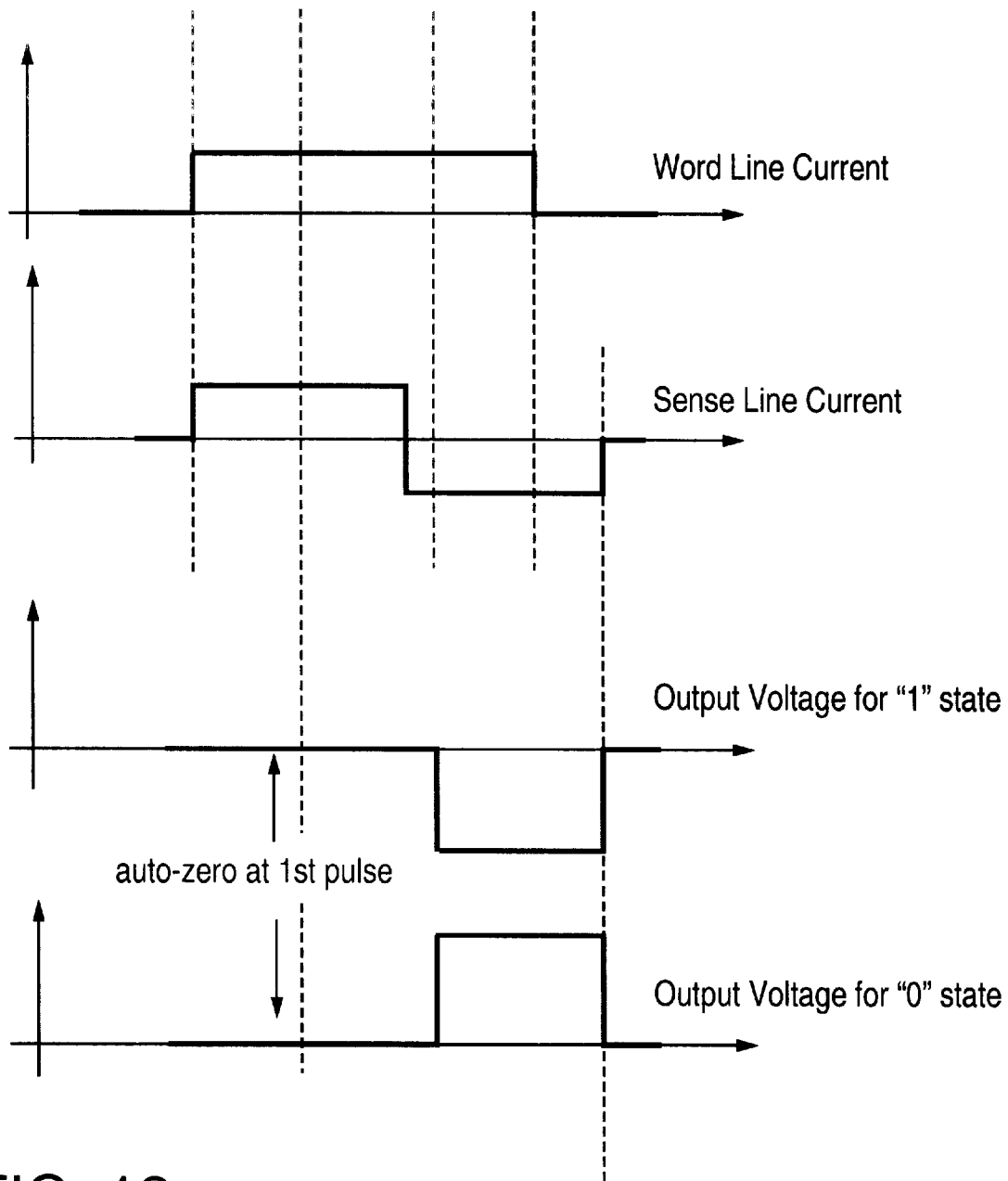
Figure 13:
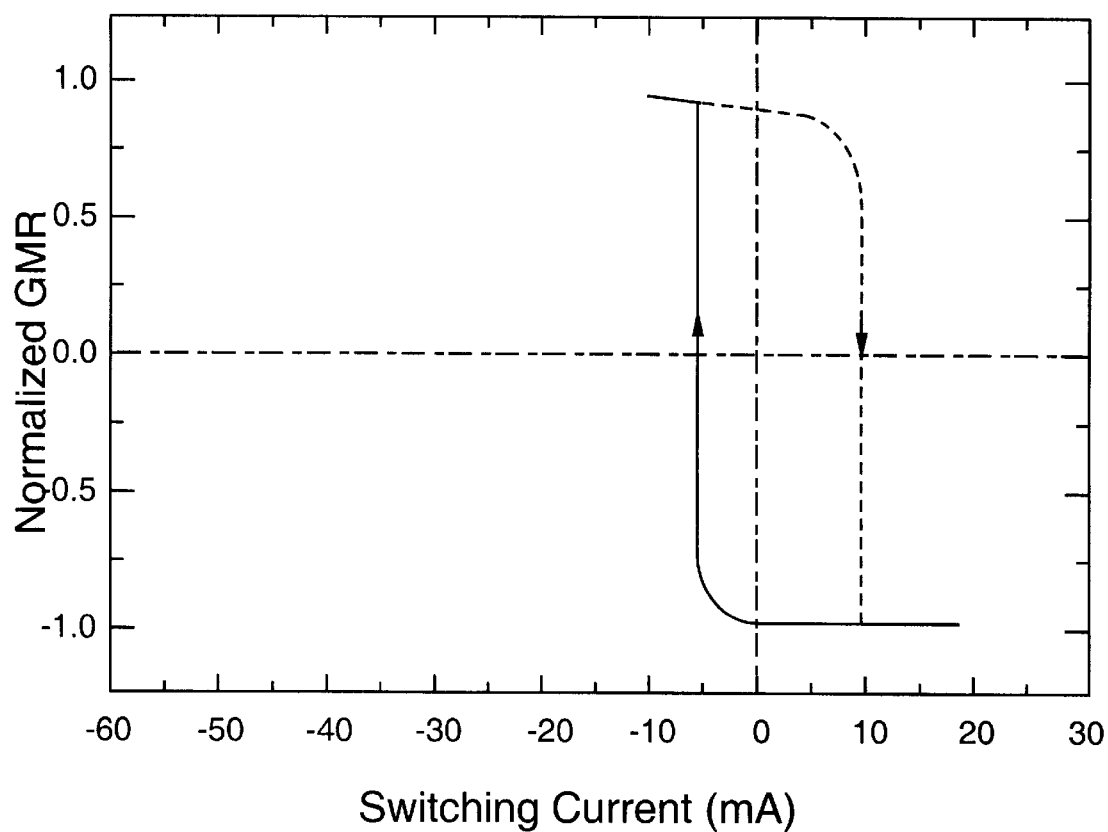
FIG. 13 is a graph illustrating resistance versus bit line current during a read operation.

FIG. 12 includes timing diagrams illustrating another embodiment of the read operation. In the alternative embodiment, the read method may be performed by providing current through the word line pairs 14, 16, providing current in a first direction through the bit line 18, measuring a first voltage (or resistance) through the memory element 12, providing current in a second, opposite direction through the bit line 18 without turning off the current through the word line pairs 14, 16, and measuring a second voltage (or resistance) through the memory element 12. In that embodiment, the current through the word line pairs 14, 16 is not stopped. Rather, it is allowed to continue while the current through the bit line 18 is reversed. FIG. 13 is a graph of normalized GMR versus bit line 18 current for the read method illustrated in FIG. 12. The graph illustrates the back switching current for changing the state of the soft set. The solid line indicates the change in resistance (or voltage) as the magnitude of bit line 18 current increases (in a negative direction) to set the soft set to the first known state. The broken line indicates the bit line current flowing in the opposite direction to change the soft set to the second, opposite state. The back switching current level is very similar to the forward switching current level.

Figure 14:
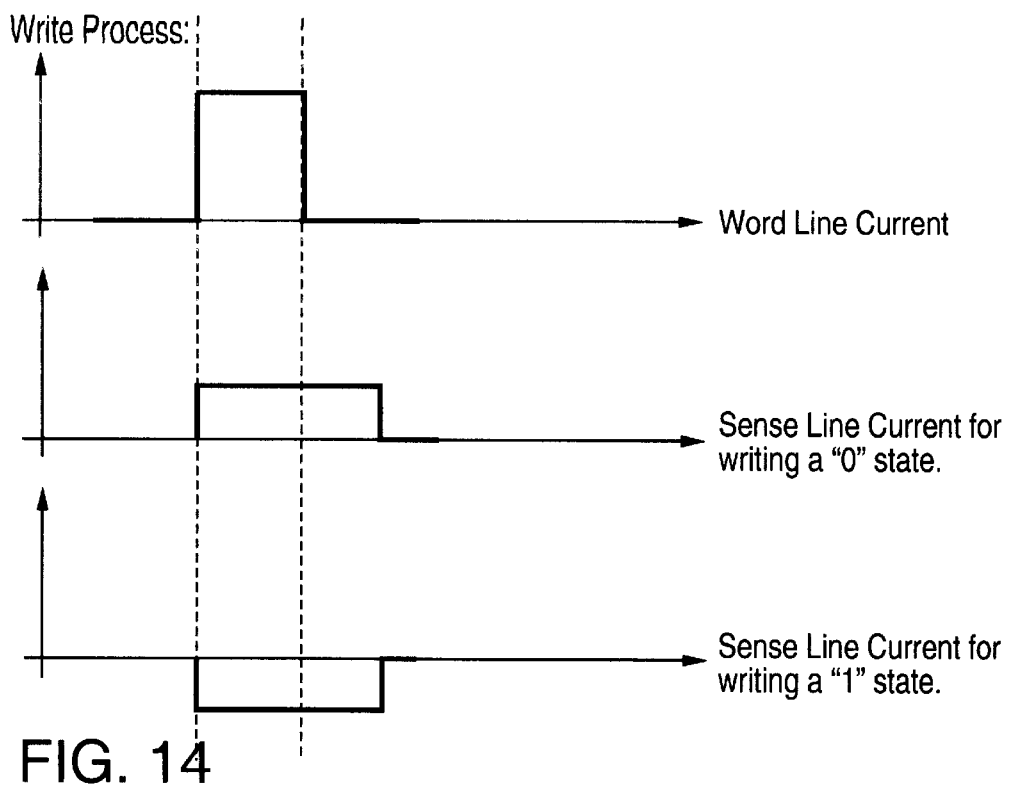
FIG. 14 is timing diagrams for a write operation.

FIG. 14 includes three timing diagrams illustrating a write operation according to the present invention. The first diagram is word line 14, 16 current versus time. The second and third diagrams are corresponding bit line 18 current for writing a "0" and for writing a "1", respectively. A relatively large (as compared to during a read operation) word line 14, 16 current is provided to affect the hard set as well as the soft set. At the same time, current is provided through the bit line 18 in a direction that induces the desired magnetization configuration in the hard set. Again, the duration of the bit line 18 current may be slightly longer than that of the word line 14, 16 current so that the bit line 18 current is flowing after the word line 14, 16 current has stopped. The direction of the bit line 18 current determines the polarity of the hard layer set magnetization circulation and, thereby, determines the memory bit state.

Figure 15:
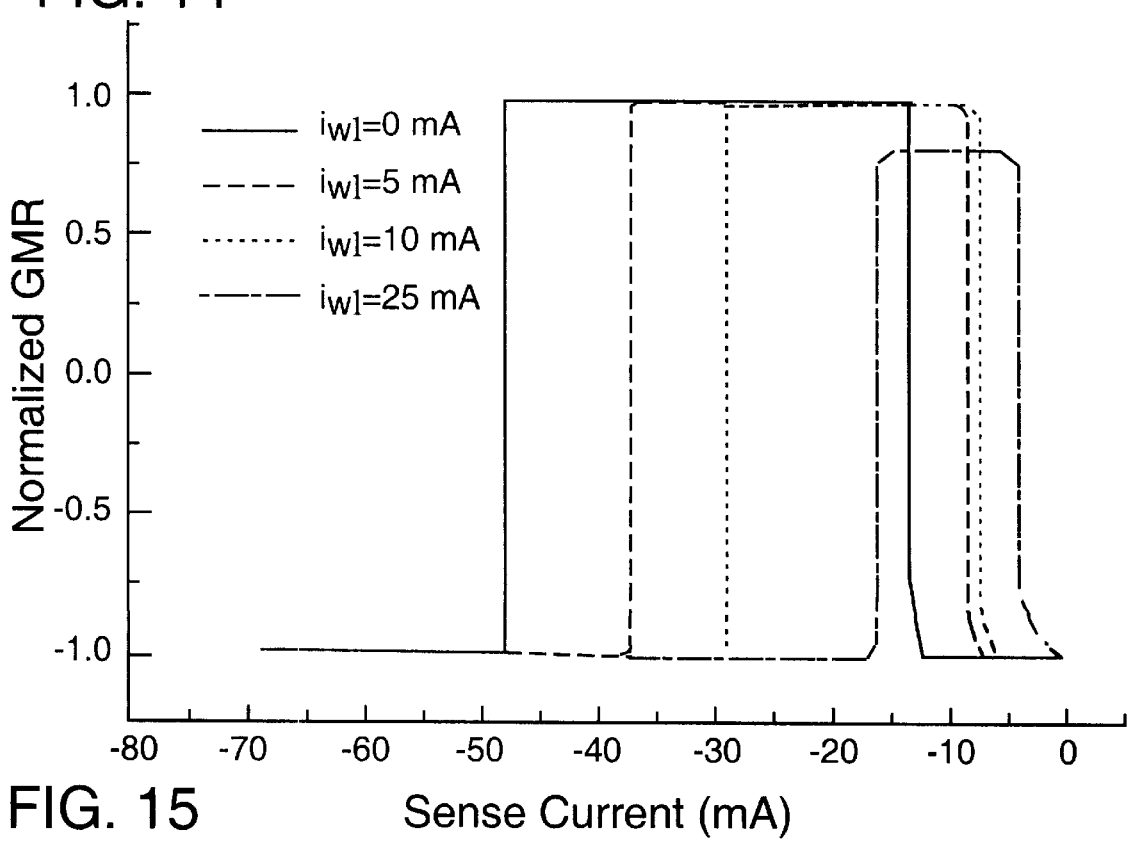
FIG. 15 is a graph illustrating resistance versus bit line current for various word line current values.

FIG. 15 is a graph showing the calculation results of the switching properties of a memory element 12 at different wordline current magnitudes. The level of bit line current needed to write the memory state depends on the level of paired word line current. For example, the graph indicates that the bit line current required to switch a hard set having no wordline current is nearly two times that which is needed to switch a hard set having 10 miliamps of wordline current. That provides a significant margin of safety against inadvertent switching of hard sets that are not selected with the wordline pairs 14, 16.

Figure 16:
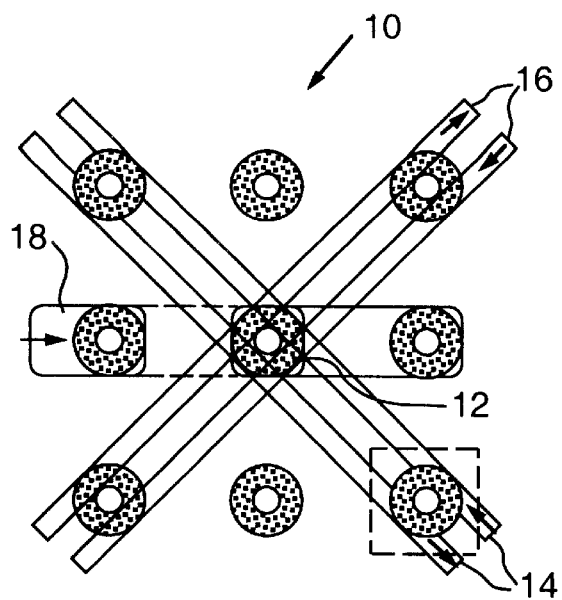
FIGS. 16–18 illustrate data integrity of non-accessed memory elements during a write operation to an adjacent memory element.
Figure 17:
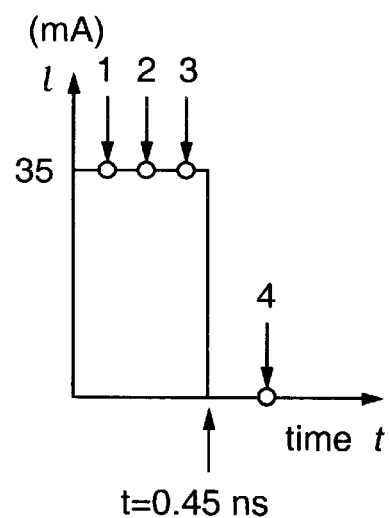
Figure 18:
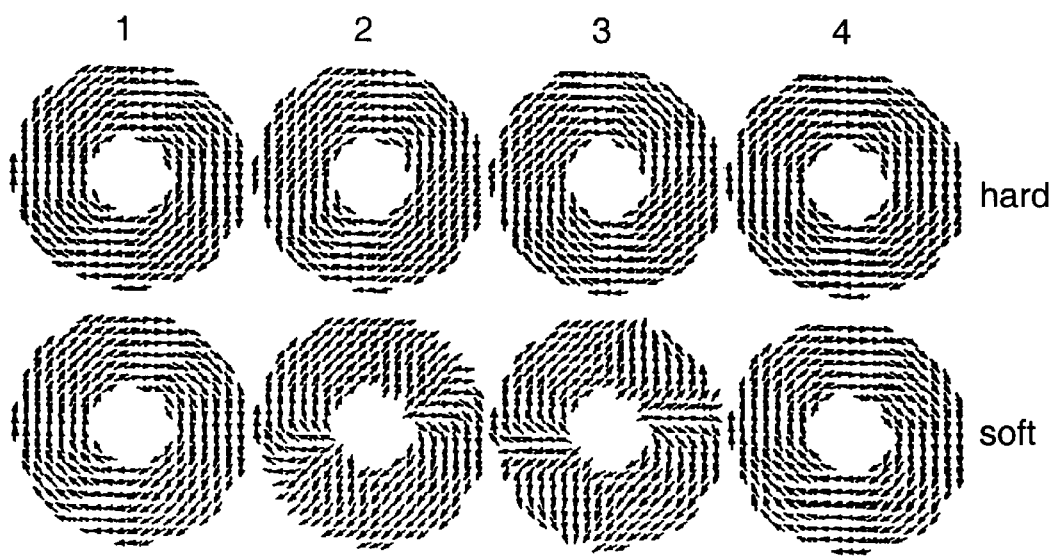

FIGS. 16, 17, and 18 illustrate how the state of a memory element along the path of a paired word line but not on the selected bit line will not be altered by a write operation on another memory element 12. FIG. 16 is a top plan view of a portion of the memory device 10. In the following example, the center memory element 12 is to be written to. The memory element in the bottom right corner shares a wordline pair 14 with the center memory element 12, but does not share the bit line 18 and is not intended to be written to. FIG. 17 is a timing diagram illustrating current through the word line 14 versus time. In this example, the current in the word line 14 is 350% greater than the normal operating word line 14 current. The purpose for the exaggerated word line 14 current is to illustrate the stability of unselected memory elements 12 in the present invention. FIG. 18 illustrates magnet field vectors for both the hard and soft layers at different points in time for the non-selected memory element in the bottom right corner of FIG. 16. Those points in time are labeled 1 through 4 and correspond to similar points identified in the graph of FIG. 17. Even at a word line current 350% greater than that of the normal operation, the magnetization configuration change in the soft set is completely reversible, namely when the word line current is off, the magnetization completely returns to the state prior to the word line current pulse. Only the hard set in the memory element 12 having current flowing through both of its word line pairs 14, 16 has its state changed by the bit line 18 current. That is because when current flows through the word lines 14, 16, the hard layer set switches at about half of the bit current needed when there is no current flowing through the word lines 14, 16. The difference gives a margin of safety for reliable operation of memory elements 12 in the memory device 10. For example, memory elements 12 that share the same bit line 18 will not have their data altered if there is no current flowing through both pairs of word lines 14, 16, even if the necessary bit line 18 current is present. Similarly, memory elements 12 that have current flowing through only one of their word line pairs 14, 16 and no current flowing through their bit line 18 will not be in danger of switching their hard set. Similarly, the soft sets of non-selected memory elements 12 should also not be in danger of switching. However, if soft sets do switch, it will no have a detrimental effect on the data stored in the corresponding memory 12 because the soft sets do not hold or otherwise affect data.

Figure 19:
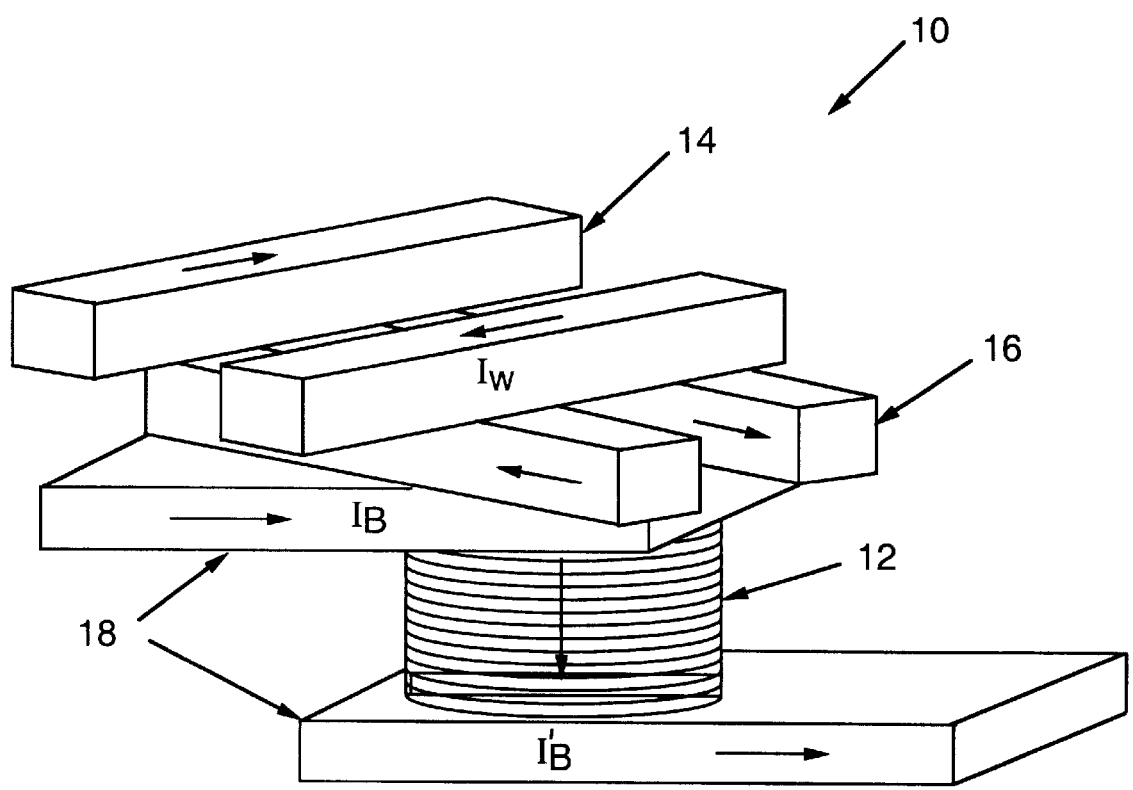
FIG. 19 is a perspective view of another embodiment of a memory device according to the present invention.
Figure 20:
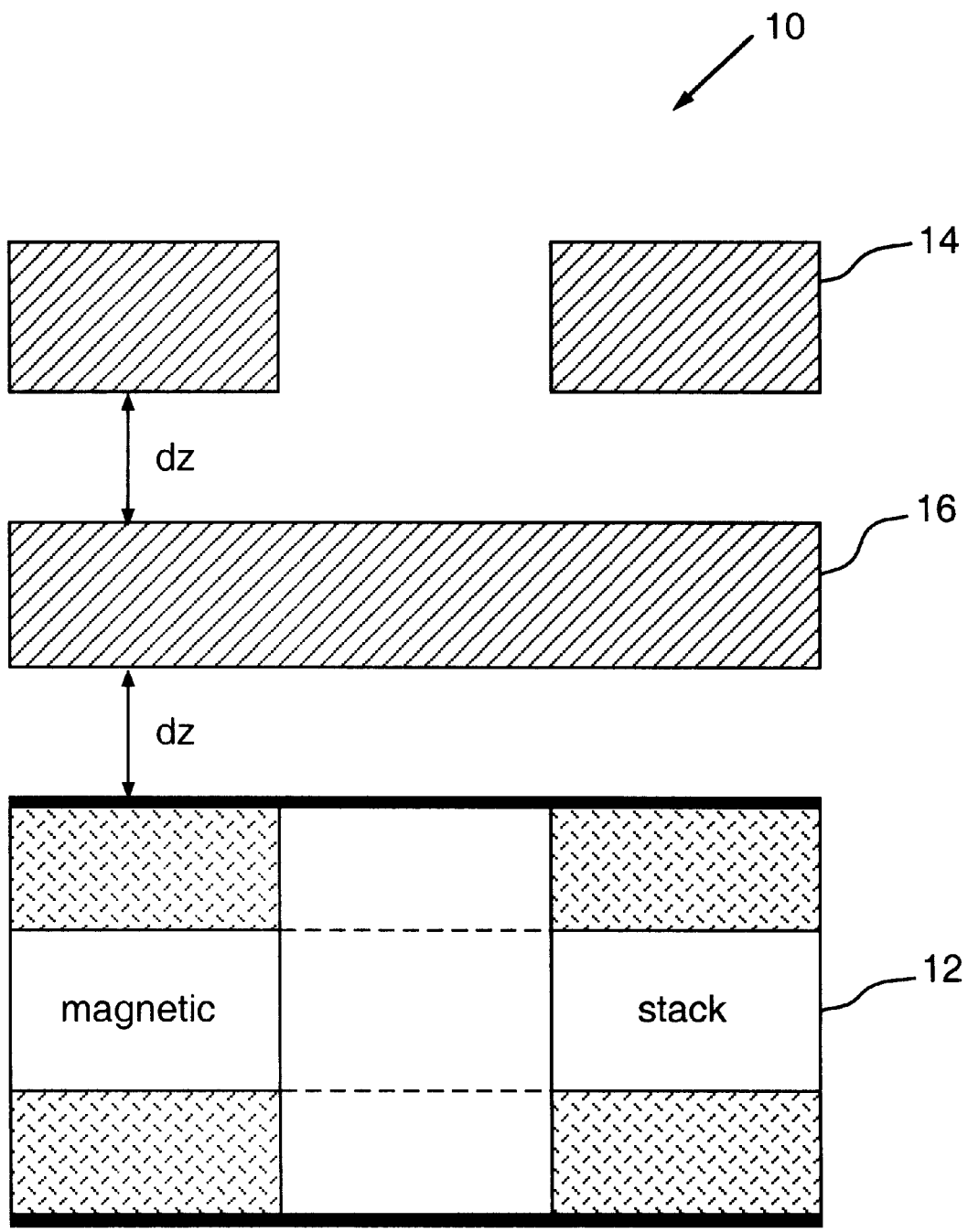
FIG. 20 is a cross-sectional view of the memory device illustrated in FIG. 19.

FIG. 19 is a perspective view of an another embodiment of the present invention wherein the word line pairs 14, 16 are both on the same side of the memory element 12. That embodiment has been found to provide a less uniform radial magnetic field than the embodiment illustrated in FIG. 1. FIG. 20 is a cross-section view of the memory device 10 illustrated in FIG. 19.

Figure 21:
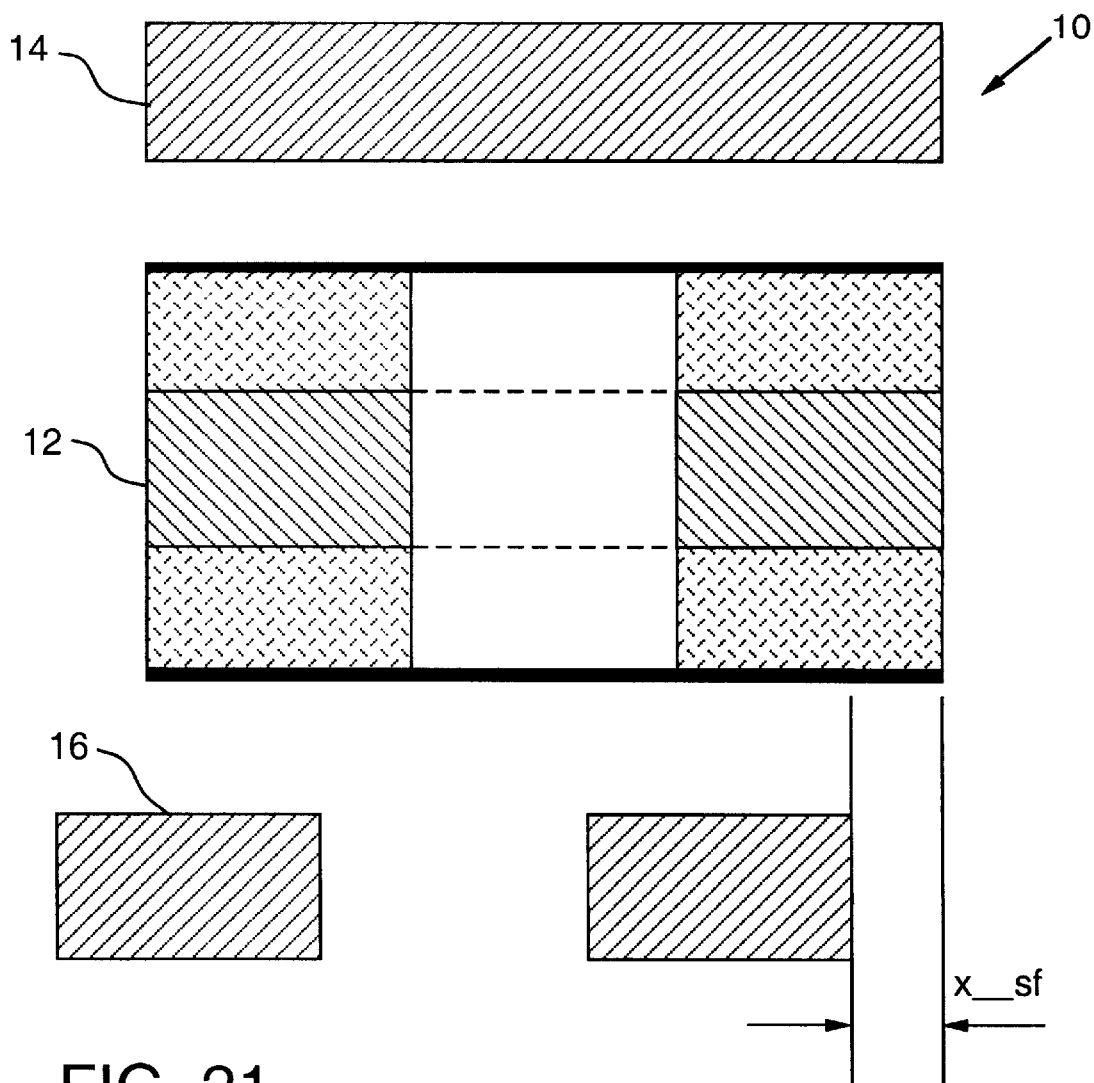
FIG. 21 is a cross-sectional view of a memory device wherein the wordlines are offset from center.
Figure 22:
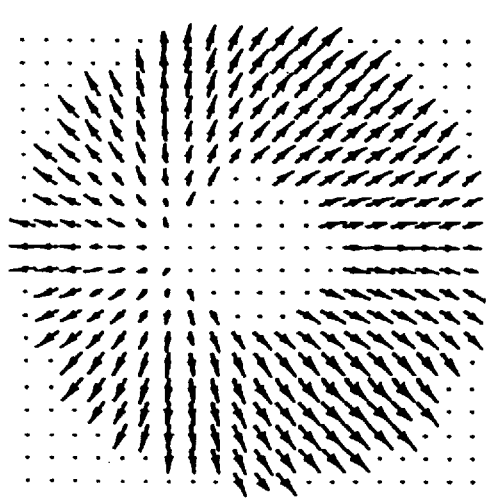
FIG. 22 is a magnetic vector diagram of a radial magnetic field generated by the memory device of FIG. 21.

FIG. 21 is a cross-sectional view of the device 10 illustrated in FIG. 1 wherein one of the word line pairs 14, 16 is offset by a distance x_sf. FIG. 22 is a magnetic field diagram of the resultant magnetic field when the offset distance x_sf=0.1 um. As can be seen in the magnetic field diagram, the resultant magnetic field is not uniformly radial. As a result, the effectiveness of the magnetic field produced by the offset word line pair 16 is less than that of a magnetic field that is more uniform.

Figure 23:
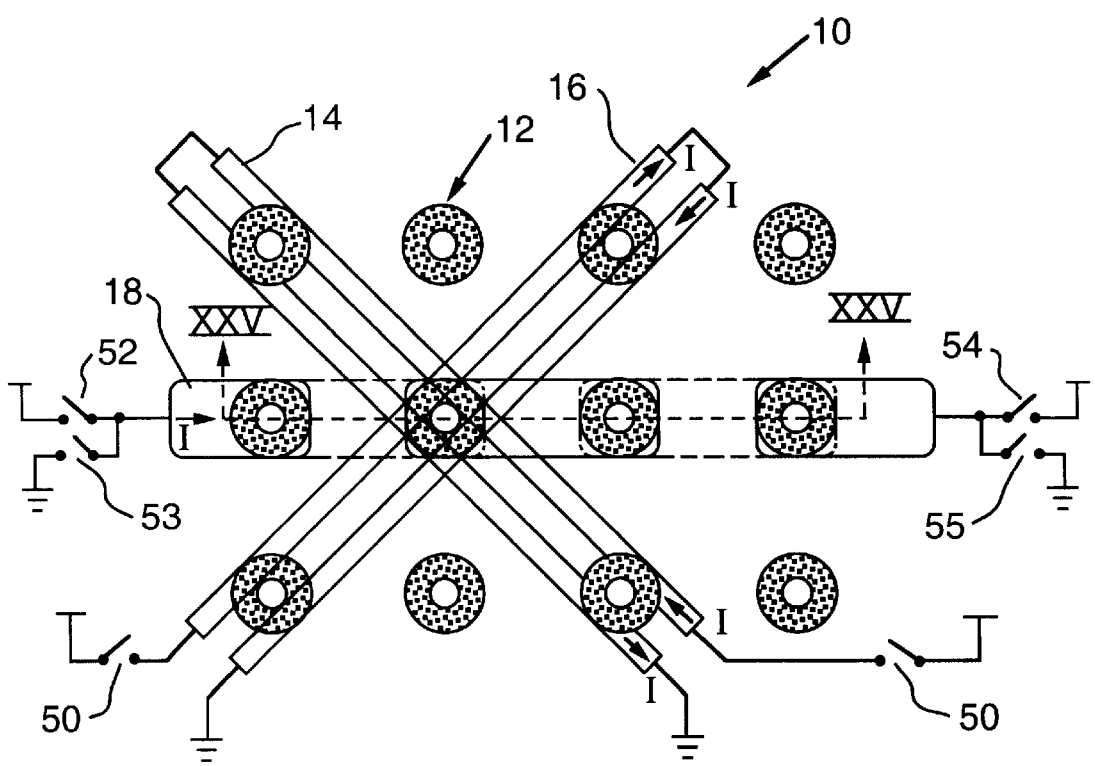
FIGS. 23 and 24 are top plan views of memory device including multiple memory elements.

FIG. 23 is a top plan view of a memory device 10 including multiple memory elements 12. Each memory element 12 has two corresponding word line pairs 14, 16. The present invention provides a mechanism to address each individual memory element with the orthogonal word line pairs 14, 16. More specifically, a memory element 12 is only selected when both of its corresponding word line pairs 14, 16 are carrying current and, therefore, generating a radial magnetic field. Other memory elements 12 having none or only one word line pair carrying current will not be switched, even if current is passing through that memory elements 12 bit line 18. For example, by selecting an appropriate word line current level, the bit line current level required to switch the magnetization polarity can differ by more than a factor of two depending on whether the word line current field is present. Therefore, only the element addressed by the paired word line currents will be switched while the memory states of the other elements along the selected bit line are unchanged.

The present invention requires less control circuitry than many conventional memory devices. For example a single switch 50, typically a transistor, may be used to control current-through each wordline pair 14, 16. Furthermore, only four switches 52–54, also typically transistors, can control each bit line 18. One pair 52, 53 of the switches controls current flowing in one direction through the bit line 18, and the other pair 54, 55 of the switches controls current flowing in the other direction.

Figure 24:
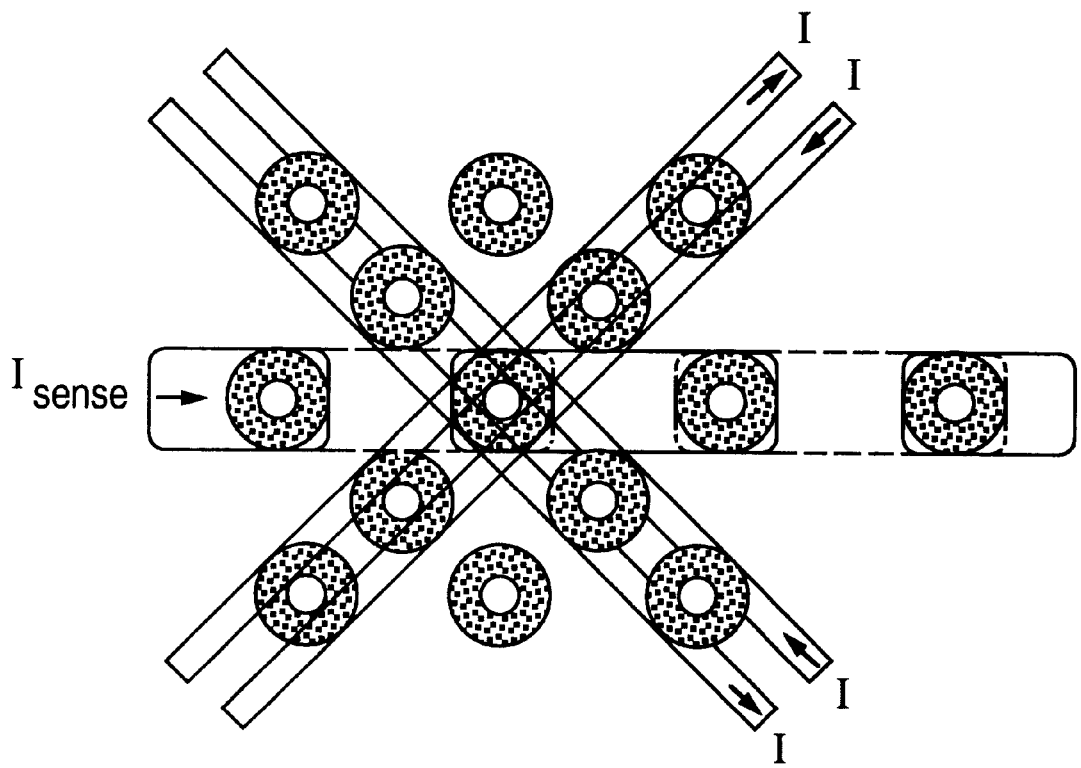

FIG. 24 is a top plan view of a memory device 10 including a more dense arrangement of memory elements 12 than was illustrated in FIG. 16.

FIG. 25 is a cross-sectional view along line XXV—XXV of FIG. 23. That view illustrates the bit line 18 connecting multiple memory elements 12 in series. As a result, current passing through the bit line 18 passes through all of the memory elements 12 that are connected by that bit line 18. Each memory element 12 represents one storage unit, or bit, in the memory device 10. The bit line 18 carries current through the memory elements 12 to read from and write to one of the memory elements 12.

FIG. 26 is a cross-sectional view of a memory device including multiple, stacked memory elements 12. Experiments have shown a memory density of about 1 gigabit per square centimeter without stacking the memory device 10. Unlike conventional solid state memory, which cannot be stacked because they require epitaxy, memory devices 10 according the present invention can be stacked, greatly increasing memory density.

Figure 27:
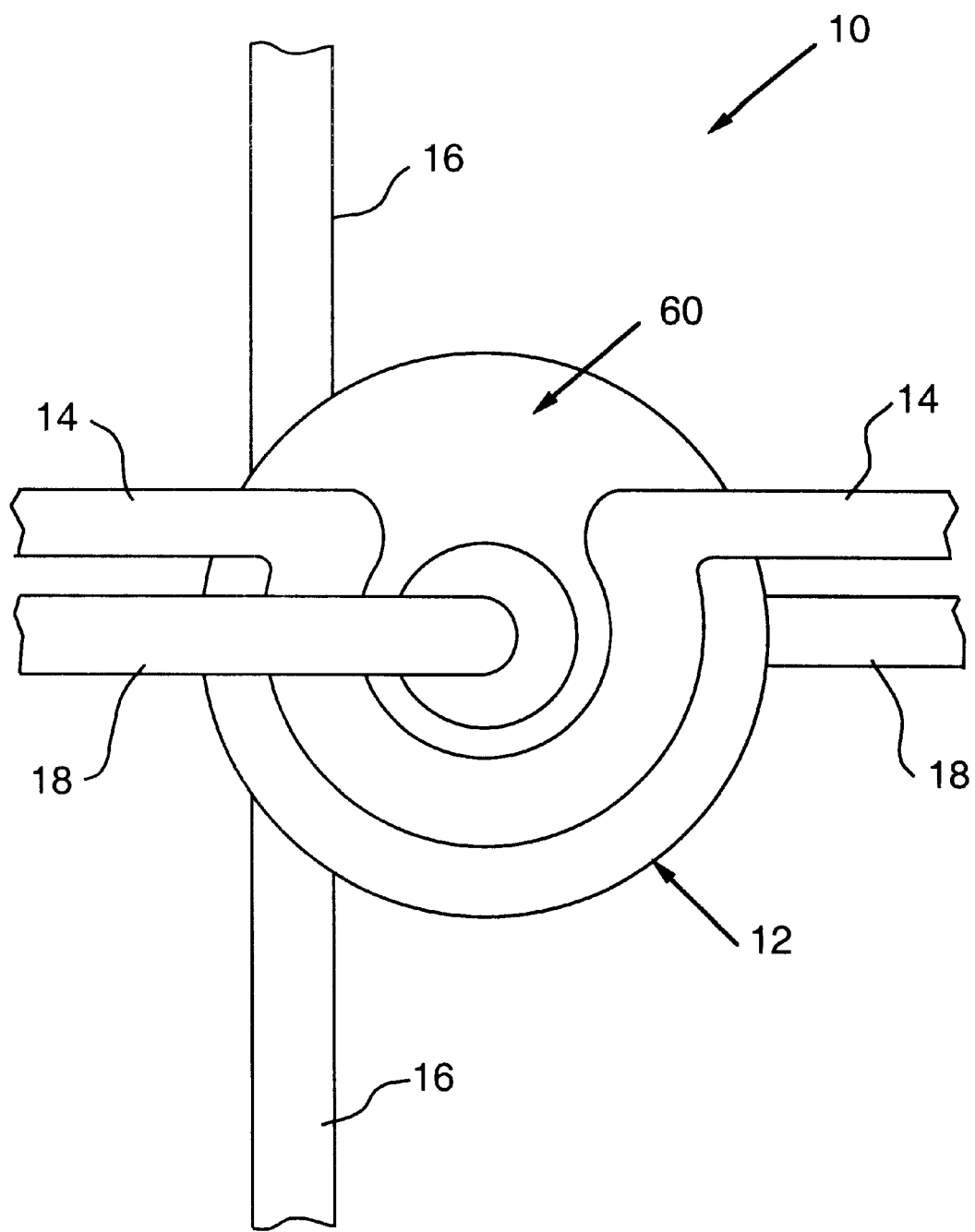
FIG. 27 is a top plan view of another embodiment of the memory device.

FIG. 27 is a top plan view of another embodiment of the present invention wherein the wordlines 14, 16 partially conform to the shape of the memory element 12. The word lines 14, 16 include curved portions that are centered around an imaginary line (see FIG. 7) defined by the portion of the bit line 18 going through the memory element 12. The curved portion does not completely conform to the memory element 12, thereby leaving a gap 60 or opening. As a result, the current in each of the word lines 14, 16 flows in only one direction around the memory element 12, thereby producing a radial magnetic field. In the illustrated embodiment the curved portion of the word lines 14, 16 curve most of the way around the imaginary line (not shown). In the illustrated embodiment, only two wordlines 14, 16 are used, one above and one below the memory element 12. In that embodiment, the wordlines 14, 16 do not need to be orthogonal because the shape of the wordlines 14, 16 naturally creates a radial magnetic field. In certain circumstances, such as if the memory element 12 and the gap 60 are sufficiently small, only a single wordline may create a sufficiently uniform radial magnetic field.

FIGS. 28 and 29 are perspective and cross-sectional views, respectively, of another embodiment of the present invention. In that embodiment, the memory device 10 is a magnetic tunneling junction (MTJ) device. In that embodiment, the memory element 12 includes a number of rings. In contrast to the previously-described embodiments, however, magnetic layers are separated from each other by an insulating layer, such as $Al_2O_3$. Both a hard layer and a soft layer are provided, with a hard layer storing the data and the soft layer being used to read the data. If the magnetization configurations in the hard and soft layers are parallel, for example both in a circular, clockwise direction, the resistance is lower than when the magnetization configurations are anti-parallel or in opposite directions. The resistance of the memory element 12 varies, such as by about 40%, depending on the relative magnetization configurations of the hard and soft layers.

The illustrated embodiment includes two separate lines, a set line 70 and a sense line 72, which collectively form the bit line 18. The set line 70 passes through holes in the memory element 12 and is insulated from the memory element 12. The set line 70 generates a magnetic field during read and write operations and sets the magnetization configuration in one or both of the soft and hard sets, as described hereinabove. The sense line 72 is electrically connected to the memory element 12 and is used to measure a change in resistance of the memory element 12 during read operations. The reason for using separate set and sense lines 70, 72 is that the resistance of the MTJ device tends to be very high, such as around 100 k ohm. As a result, in some applications it may be difficult to accurately read the resistance change if the set and sense lines 70, 72 are electrically connected in parallel, as was done in earlier-described embodiments. Of course, in an appropriate application, the MJT device may include a bit line 18 like that used in the non-MTJ devices described hereinabove. In addition, the separate set and sense lines 70, 72 may be used on the non-MTJ devices described hereinabove, and the various elements and embodiments of the previously-described devices may also be applied to an MTJ device.

FIG. 30 is a graph illustrating the switching of a ring-shaped MTJ device with a separate, set line 70. The graph is normalized GMR (measured through the sense line 72) versus current through the set line 70. The graph is based on the simulation of one hard magnetic layer and one soft magnetic layer sandwiching an insulating layer 32. When current flows through the paired wordlines 14, 16, the switching field for both the hard layer and the soft layer is significantly reduced. As in earlier-described embodiments, the resistance of the memory element 12 changes based on the relative magnetization configurations in the hard and soft magnetic layers.

Figure 31:
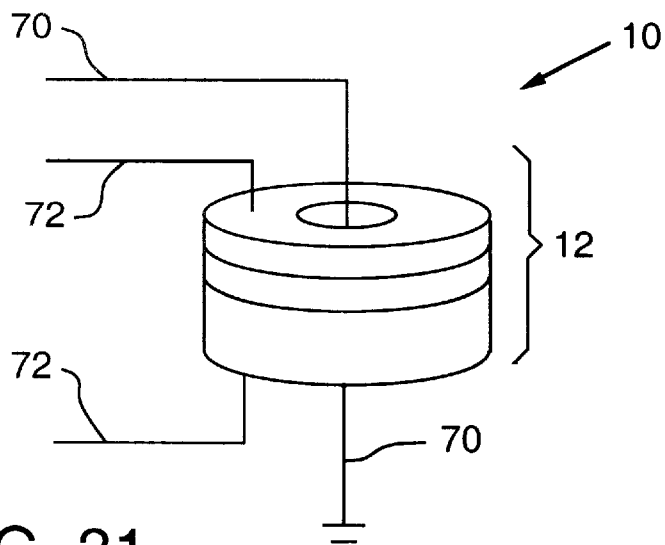
FIG. 31 is a combination perspective view and circuit schematic illustrating one embodiment of the present invention as a transistor.

The present invention includes devices other than memory devices. For example, the present invention may be used in place of conventional circuit components, such as transistors. FIG. 31 is a combination perspective view and circuit schematic illustrating one embodiment of a device 10 of the present invention as it may be used as a transistor. In that embodiment, the device 10 includes a memory element 12 including a hard set, a soft set, and conductors between the hard and soft sets. The device 10 also includes one or more wordlines 14, 16 (not shown) and separate set 70 and sense 72 lines. In that embodiment the wordlines 14, 16 (not shown) may be used to enable the device 10, the set line 70 is the input to the device (much like the base of a bipolar junction transistor or the gate of a field effect transistor), and the sense line provides output. In that embodiment, the device 10 may be initialized so that the hard set is in a predetermined state. The hard set may be left in that predetermined state at all times because the functions of a transistors can be accomplished by only changing the state of the soft set. The soft set may be changed by connecting one side of the set line 70 to a logic input signal, and connecting the other side of the set line 70 to ground, wherein the voltage of the logic signal ranges from, for example, +3 volts for a logic high signal to −3 volts for a logic low signal. As a result, current will flow through the set line 70 in one direction when a logic high is applied, and current will flow in the opposite direction when a logic low is applied. The current flow will result in magnetization configurations indicative of the input signal, which results in different resistance through the memory element 12, as measured by the sense line 72. For example, when a signal provided on the set line results in an anti-parallel orientation of the hard and soft sets, the device provides a high resistance to the sense line 72 (much like when a BJT or FET does not have an appropriate voltage on its base or gate, respectively). Conversely, when the hard and soft sets are parallel, a low resistance is provided (much like when a BJT or FET does have an appropriate voltage on its base or gate, respectively). Accordingly, the present invention may be applied to the design of transistors, as well as other solid state devices.

Figure 32:
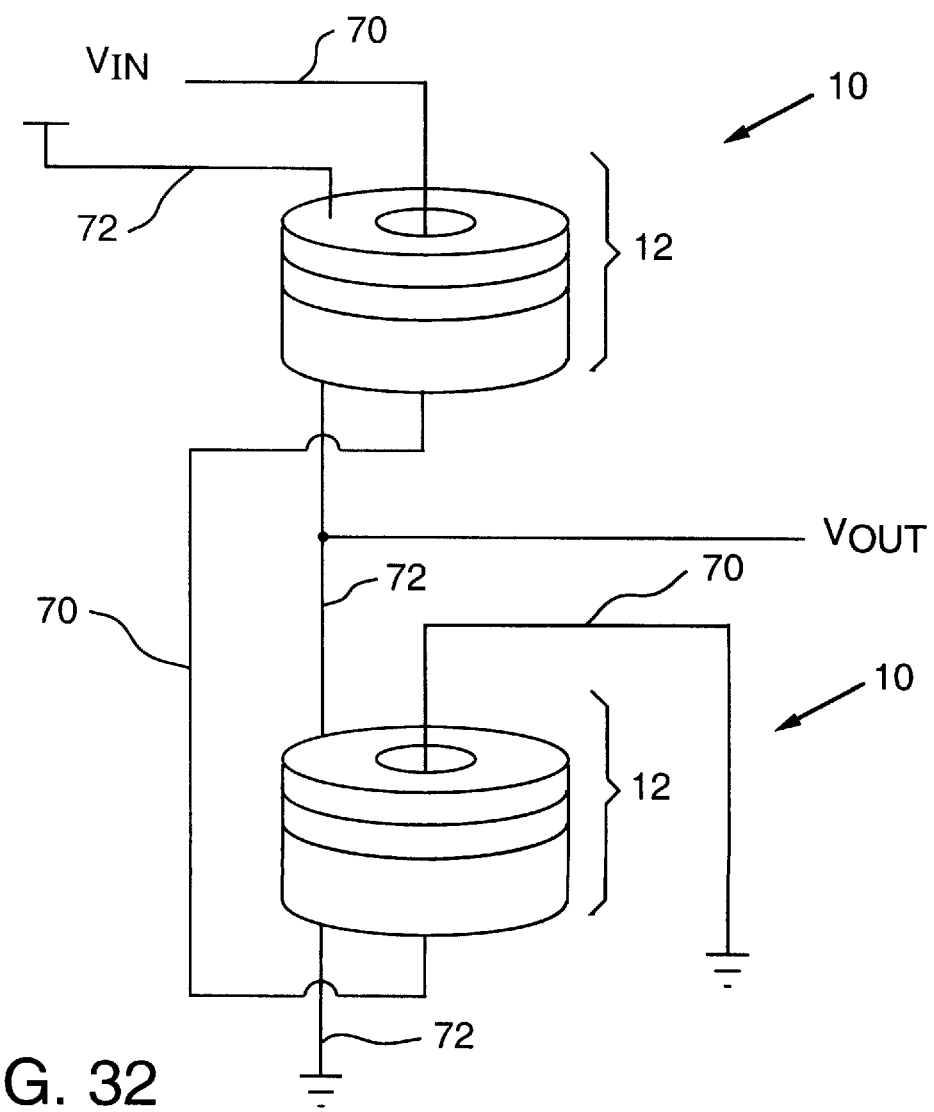
FIG. 32 is a combination perspective view and circuit schematic illustrating one embodiment of the present invention as an inverter.

FIG. 32 is a combination perspective view and circuit schematic illustrating the present invention used to form an inverter. In that embodiment, two devices 10 are used and their sense lines 72 are connected in series. An output signal $V_{out}$ is taken from a sense line 72 node between the devices 10. An input signal $V_{in}$ is provided at one end of the set line 70, and ground is provided at the other end. The set line 70 runs through one device in one direction, and through the other device in the opposite direction so that when one device exhibits low resistance, the other exhibits high resistance, as in a CMOS design. Unlike a CMOS design, however, the input signal $V_{in}$ need only be applied long enough to register the correct output $V_{out}$, and thereafter the input signal $V_{in}$ may be removed and the inverter will continue to produce the correct output. Many other circuits and circuit components may also be formed using the present invention.

Figure 33:
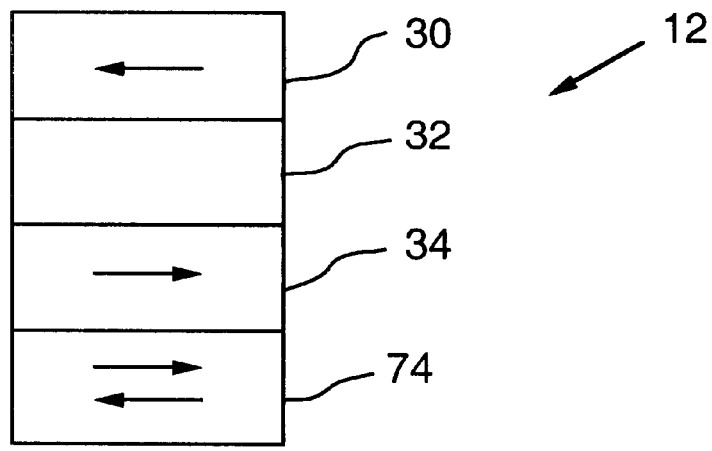
FIG. 33 is a plan view of another embodiment of the memory element.

FIG. 33 is a plan view of another embodiment of the present invention. That embodiment will be described in terms of a memory device, although it is also applicable for use as a logic device. In that embodiment, an anti-ferromagnetic material 74, such as NiMn, IrMn, or PtMn, is adjacent to one of the magnetic layers 34 forming the memory element 12. The anti-ferromagnetic material 74 pins the adjacent magnetic layer 34, which is defined as the hard set because it stays pinned in a certain magnetization configuration through an anti-ferromagnetic exchange. The other magnetic layer 30 is then the soft set because it changes to reflect the data stored in the memory element 12. In that embodiment the hard and soft layers may have the same thickness and may have magnetic moments of the same magnitude. In another embodiment, the hard layer may be thinner and have a less magnetic moment than the soft layer because the anti-ferromagnetic exchange pins the hard layer in a certain magnetization configuration. Because the magnetization configuration of the pinned layer 34 is known, certain advantages are realized. For example, because the magnetization configuration of the hard set or pinned layer 34 is known, the magnetization configuration of the other layer or soft set layer 30 is determinative of the relative magnetization configuration of the memory element 12. In that embodiment, a read operation may be performed by measuring the resistance of the memory element 12, changing the soft set layer 30 to a known magnetization configuration, and measuring the resistance of the memory element 12 again. If the resistance is unchanged, the magnetization configuration of the soft set layer 30 was the same as the known magnetization configuration to which the soft set layer 30 was changed. If the resistance changes, the soft set layer 30 was the opposite magnetization configuration to which the soft set layer 30 was changed. If it is determined that the soft set layer 30 had a magnetization configuration opposite of the known magnetization configuration to which it was changed, the read operation may be followed by a "refresh" operation to return the soft set layer 30 to its original magnetization configuration. In a logic device, such as a transistor, the hard set layer 34 may be fixed to a known magnetization configuration that is convenient for the logic signals used to control the device.

Figure 34:
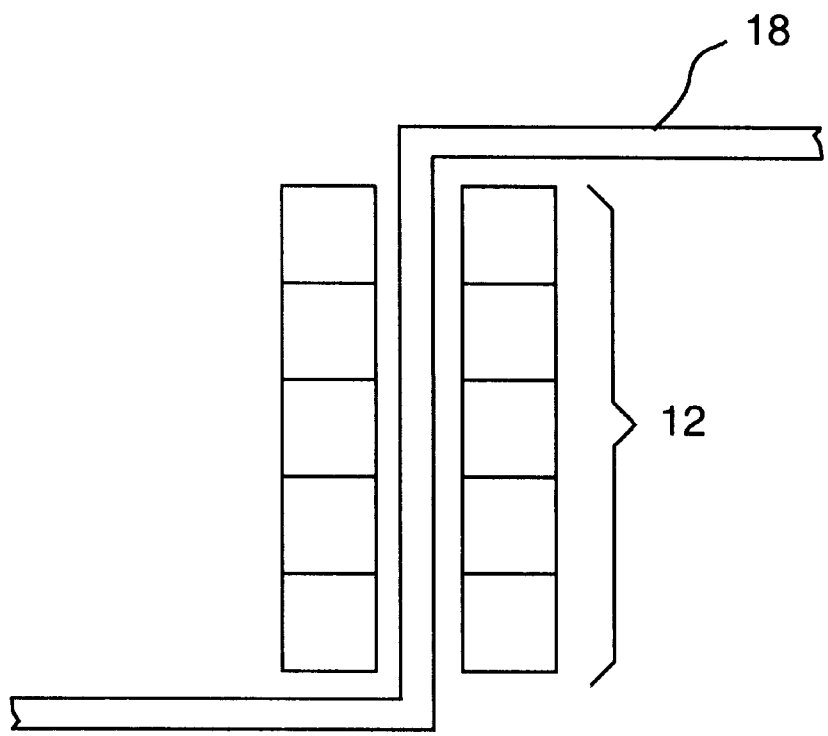
FIG. 34 is a cross-sectional view of another embodiment of the bit line.

FIG. 34 is a cross-sectional view of another embodiment of the present invention wherein the word line 14 passes through the memory element 12, resulting in part of the word line 14 above the memory element 12 and part of the word line 14 below the memory element 12. The word line includes a first portion above the memory element 12 and parallel to the layers forming the memory element 12, a second portion below the memory element 12 and parallel to the layers forming the memory element 12, and a portion through the memory element 12 and connecting the other two portions of the word line together. The magnetic field produced by the word line 14 is less uniformly radial than that produced by some other embodiments of the present invention. Nonetheless, in certain applications that embodiment will provide for reliable switching of the memory element 12.

The present invention has been described in terms of a device 10 including at least two magnetic layers. Advantages of the present invention, however, may be realized with embodiments having only a single magnetic layer. For example, a single magnetic layer may be used to store data. The present invention provides for reliable switching of that single magnetic layer by using, for example, one of the word line and bit line combinations described hereinabove. In such an embodiment, the data stored on the device may be determined by, for example, sensing the magnetization configuration remotely, as opposed to sensing the magnetization configuration by measuring the resistance of the memory element. Those of ordinary skill in the art will recognize those and other variations from the teachings provided herein.

The present invention may be formed with conventional semiconductor or micro-machine fabrication techniques. For example, materials may be deposited using chemical vapor deposition ("CVD") or sputtering techniques. Materials may be selectively removed, for example, with lithographic techniques such as reactive ion etching or wet or dry etching with an appropriate mask. Other fabrication techniques, of course, may also be used. The following is an illustration of one manner of fabricating a memory device 10 like that illustrated in FIG. 1, although the process may be modified to fabricate other embodiments of the present invention.

Figure 35:
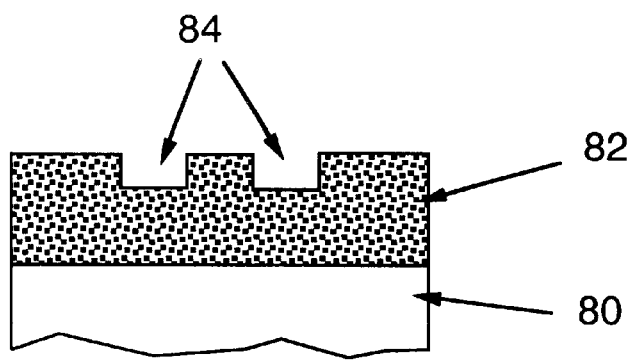
FIGS. 35–43 are cross-sectional views of a fabrication of a memory device according to the present invention.

FIG. 35 is a cross-sectional view of an early stage of fabrication of a memory device 10 constructed according to the present invention. A substrate 80, such as a silicon substrate, forms the basis for the device 10. An insulating layer 82, such as SiN, is formed on top of the substrate 80, and recesses 84 are formed in the insulating layer 82.

Figure 36:
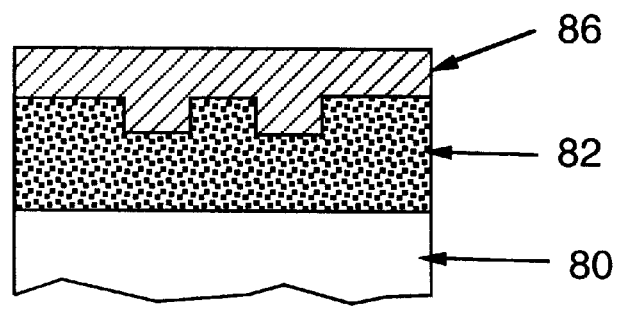

FIG. 36 illustrates the fabrication after a conductive layer 86, such as copper, is formed over the insulating layer 82 and fills the holes 84.

Figure 37:
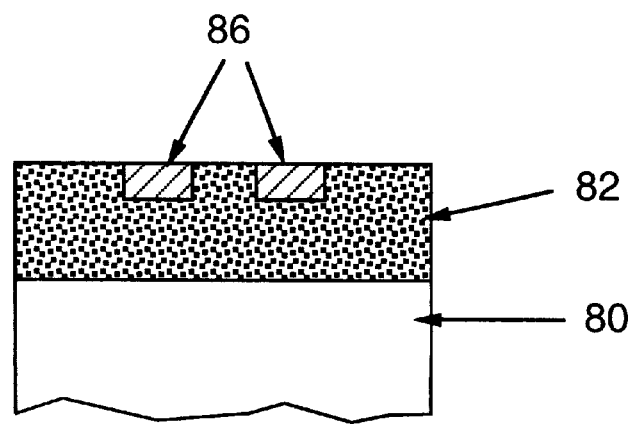

FIG. 37 illustrates the fabrication after the conductive layer 86 has been partially removed to expose the insulating layer 82 and to leave the conductive material 86 in the openings 84. The conductive material may be partially removed with a mechanical abrasion technique, such as chemical mechanical polishing. The conductive material 86 in the openings 84 will form the lower wordline pairs 16.

Figure 38:
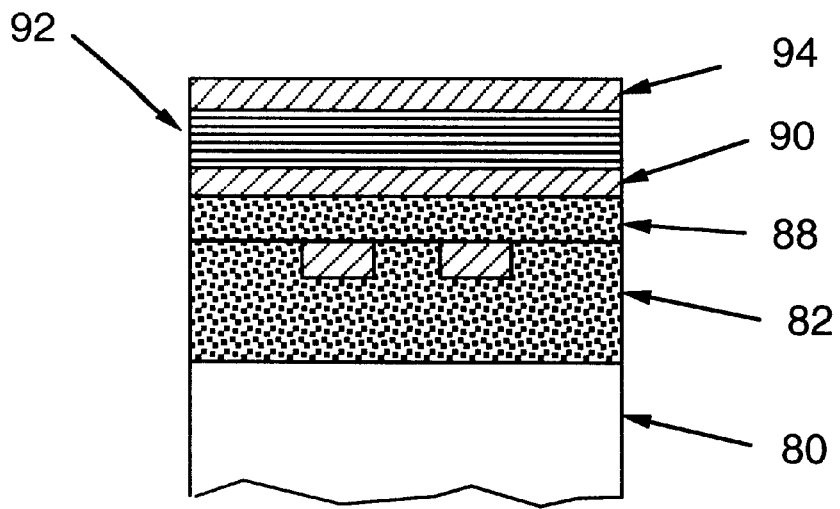

FIG. 38 illustrates the fabrication after an insulating layer 88 is formed on top of the conductive material 86 in the openings 84, after a conductive material 90 is formed on top of the insulating layer 88, after alternating layers 92 of magnetic and conductive material that will form the memory element 12 are formed on top of the conductive material 90, and after conductive material 94 is formed on top of the alternating layers 92. The insulating layer 88 may be, for example SiN. The conductive layers 90, 94 may be, for example, copper. The layers 92 may be formed of materials and at thicknesses as described hereinabove with respect to the memory element 12.

Figure 39:
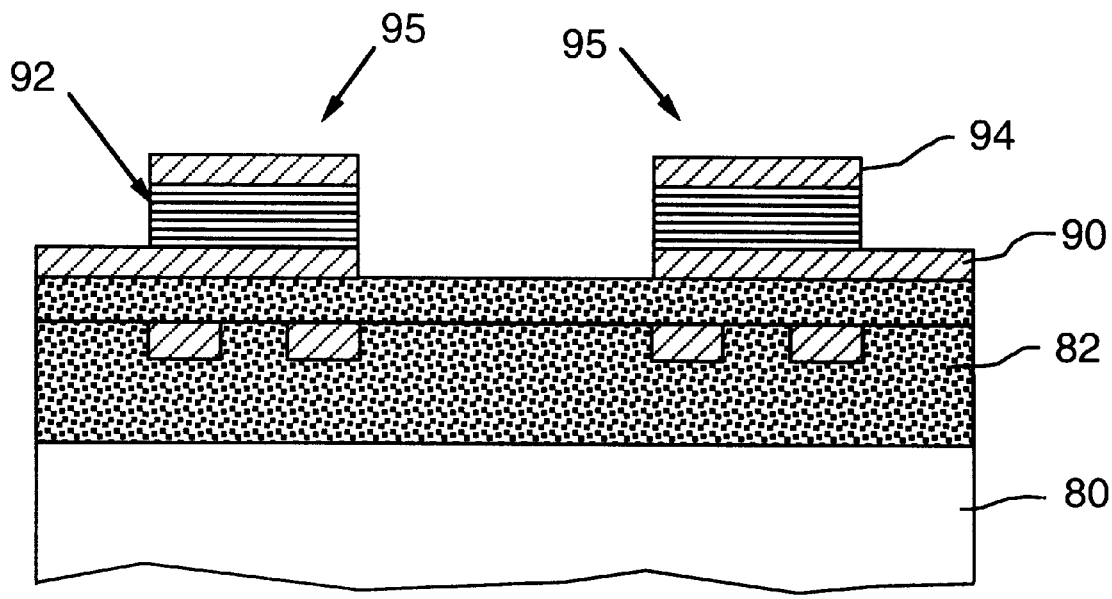

FIG. 39 illustrates the fabrication after selective removal has more clearly identified the stacks 95 that will form the memory elements 12 and the conductive material 90 is more easily identified as part of the bit line 18. The conductive layer 94 will also form part of the bit line 18 and provides for a protective buffer to prevent accidental removal of the top layers 92 of the memory element 12.

Figure 40:
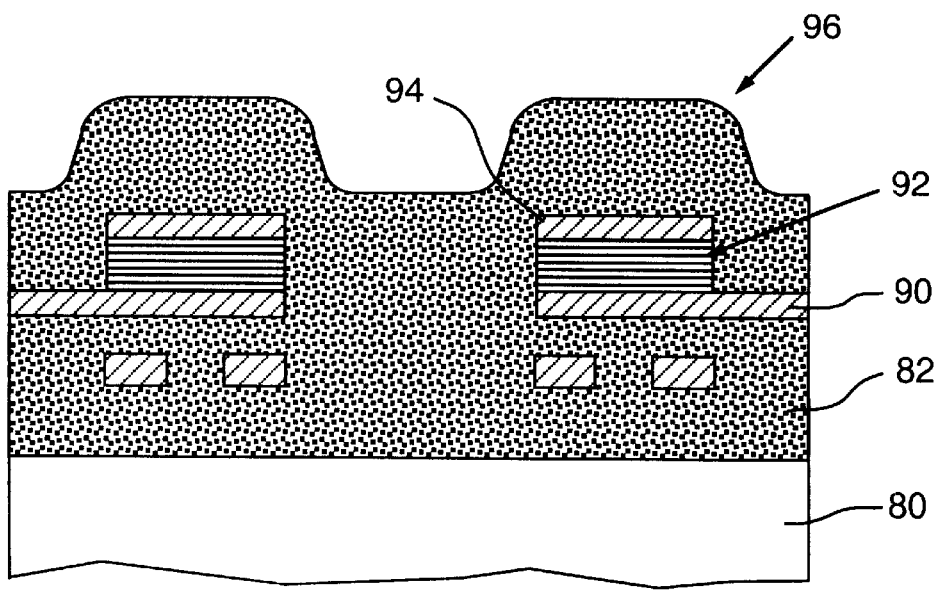

FIG. 40 illustrates the fabrication after an insulating layer 96, such as SiN, is formed around and above the layers 92 and the conductive layer 94.

Figure 41:
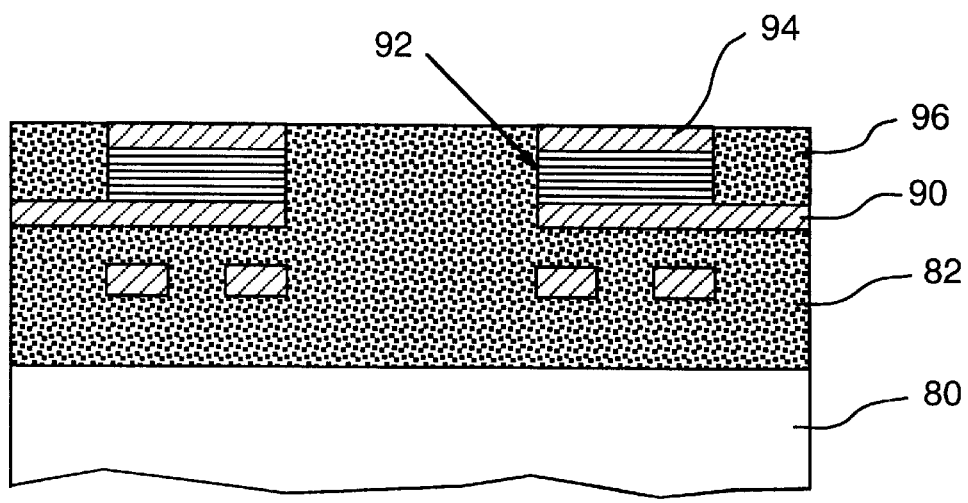

FIG. 41 illustrates the fabrication after the insulating layer 96 has been partially removed to yield a flat top and to expose the conductive layers 94.

Figure 42:
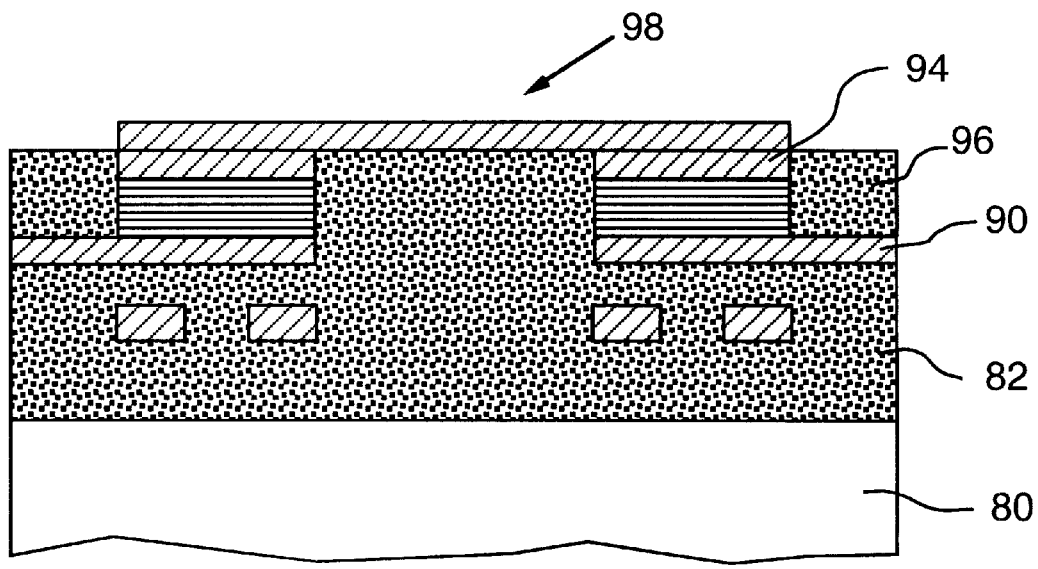

FIG. 42 illustrates the fabrication after a conductive layer 98 has been formed on top of the conductive layer 94 and on top of the insulating layer 96. That conductive layer may be, for example, copper. The conductive layer 98 forms part of the bit line 18.

Figure 43:
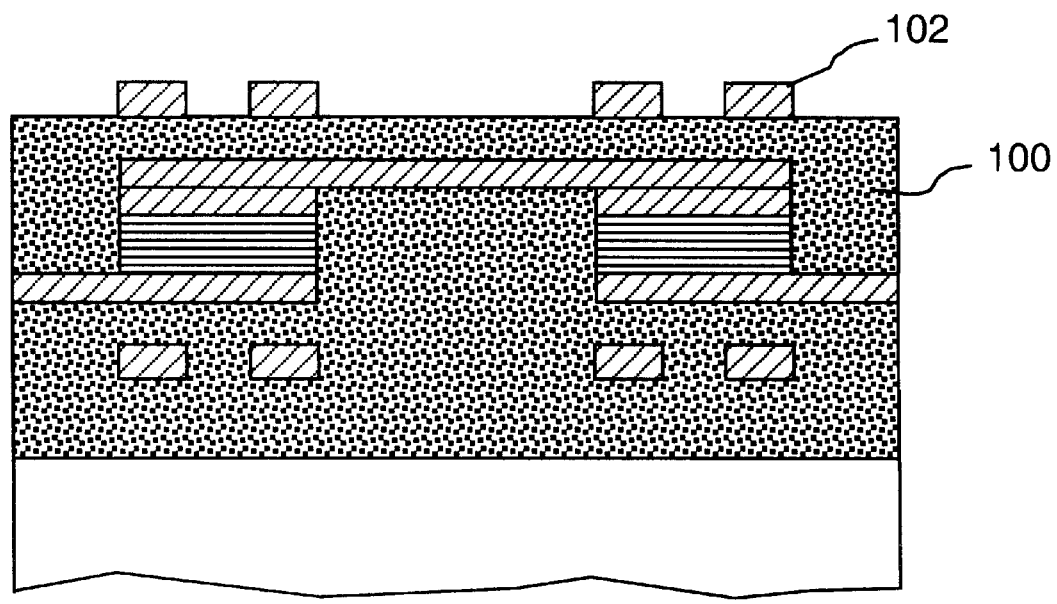

FIG. 43 illustrates the fabrication after an insulating layer 100 and a conductive layers 102 are formed. The insulating layer 100 may be, for example, SiN, and the conductive layer 102 may be, for example, copper. The conductive layer 102 may be formed in a manner analogous to the conductive strips 86 forming the lower pairs of wordlines 16. The conductive material 102 forms the top pair of wordlines 14. Thereafter another insulating layer may be formed. The process may also be repeated to form stacked memory elements.

The present invention has been described in terms of several embodiments. Those of ordinary skill in the art will recognize that many other modifications and variations of the present invention may be implemented. For example, the device may be implemented with combinations of word lines 14, 16, memory elements 12, and bit lines 18 other than those combinations explicitly described herein. Furthermore, the present invention may be practiced with variations and embodiments not explicitly described herein. The foregoing description and the following claims are intended to cover all such modifications and variations.

What is claimed is:

1. A device, comprising:
   a magnetic material having a circular magnetization configuration; and
   a word line for producing a radial magnetic field around the magnetic material.

2. The device of claim 1, where the radial magnetic field is radial inward.

3. The device of claim 1, where the radial magnetic field is radial outward.

4. The device of claim 1, wherein the magnetic material is in the form of a disk.

5. The device of claim 1, wherein the magnetic material is a ring defining a hole.

6. The device of claim 1, further comprising a second magnetic material having a circular magnetization configuration, the second magnetic material being parallel to the magnetic material.

7. The device of claim 6, wherein the magnetic material and the second magnetic material are separated by an electrically conductive layer.

8. The device of claim 7, further comprising an anti-ferromagnetic material adjacent to the magnetic material.

9. The device of claim 6, wherein the magnetic material and the second magnetic material are separated by an electrically insulating layer.

10. The device of claim 1, wherein the word line includes:
    first and second word lines electrically insulated from the magnetic material, parallel to each other, wherein the first and second word lines are parallel to the magnetic material, and forming a first word line pair; and
    third and fourth word lines electrically insulated from the magnetic material, parallel to each other, wherein the third and fourth word lines are parallel to the magnetic material, and forming a second word line pair, wherein the first and second word line pairs are orthogonal to each other.

11. The device of claim 10, wherein the first and second word line pairs are separated from each other by the magnetic material.

12. The device of claim 10, wherein the first and second word line pairs are on a common side of the magnetic material.

13. The device of claim 1, wherein:
the magnetization configuration is centered about an imaginary line normal to a plane of the magnetization configuration; and
the word line includes a curved portion around the imaginary line.

14. The device of claim 13, wherein the curved portion of the word line is curved more than 180 degrees and less than 360 degrees around the imaginary line.

15. The device of claim 13, further comprising a second word line including a curved portion around the imaginary line, and wherein the word line and the second word line are separated from each other by the magnetic material.

16. The device of claim 13, further comprising a second word line including a curved portion around the imaginary line, and wherein the word line and the second word line are on a common side of the magnetic material.

17. The device of claim 5, wherein the word line includes:
a first portion parallel to the magnetic material;
a second portion parallel to the magnetic material, wherein the first and second portions are separated from each other by the magnetic material; and
a portion normal to the magnetic material, located in the hole defined by the magnetic material, and insulated from the magnetic material.

18. A device, comprising:
first magnetic ring defining a first hole and located in a first plane;
a second magnetic ring defining a second hole and located in a second plane;
a bit line including a set line in the first and second holes, and a sense line electrically connected to the first and second rings;
first and second word lines in a third plane parallel to the first and second planes and electrically insulated from the first and second rings, the first and second word lines forming a first word line pair; and
third and fourth word lines parallel to each other and in a fourth plane parallel to the third plane and forming a second word line pair, wherein the first and second word line pairs are orthogonal to each other.

19. The device of claim 18, wherein:
the first magnetic layer has a first magnetization configuration that is circular about the set line;
the second magnetic layer has a second magnetization configuration that is circular about the set line.

20. The device of claim 19, wherein the set line is perpendicular to the first and second planes.

21. The device of claim 20, wherein the first and second magnetic layers are each concentric about the set line.

22. The device of claim 19, wherein:
the first magnetization configuration is in the first plane; and
the second magnetization configuration is in the second plane.

23. The device of claim 22, wherein the first and second magnetization configurations are concentric about the set line.

24. The device of claim 18, wherein:
the first and second magnetic layers are formed from the same material;
the first magnetic layer has a first thickness; and
the second magnetic layer has a second thickness that is greater than the first thickness.

25. The device of claim 18, wherein:
the first and second magnetic layers are formed from different materials; and
the first and second layers have equal thicknesses.

26. The device of claim 18, wherein the set line and the sense line are electrically connected to each other in parallel.

27. The device of claim 18, wherein the set line and the sense line are electrically insulated from each other.

28. The device of claim 18, further comprising an electrical insulator in the first and second holes and between the set line and the first and second magnetic layers.

29. The device of claim 18, wherein the first and second word line pairs are separated from each other by the first and second magnetic layers.

30. The device of claim 29, wherein the first and second word line pairs are on a common side of the first and second magnetic layers.

31. The device of claim 18, further comprising an electrically conductive layer between the first and second magnetic layers, the conductive layer defining a hole.

32. The device of claim 31, wherein:
the first magnetic layer is one of a plurality of first magnetic layers, each defining a hole through which the set line passes;
the second magnetic layer is one of a plurality of second magnetic layers, each defining a hole through which the set line passes;
the conductive layer is one of a plurality of conductive layers, each defining a hole through which the set line passes; and
the first magnetic layers, the second magnetic layers, and the conductive layers are oriented in a repeating pattern of: first magnetic layer, conductive layer, second magnetic layer, and conductive layer.

33. The device of claim 18, further comprising an electrical insulator between the set line and each of the first and second magnetic layers.

34. The device of claim 18, wherein:
the first magnetic ring has a magnetization configuration having a first magnitude; and
the second magnetic ring has a magnetization configuration having a second magnitude; the second magnitude being greater than the first magnitude.

35. A device, comprising
a first magnetic ring defining a hole and located in a first plane;
a second magnetic ring defining a hole and located in a second plane, the second plane being parallel to the first plane;
an electrically conductive ring defining a hole, located between the first and second magnetic rings and in a third plane parallel to the first and second planes;
a bit line including a set line and a sense line, the set line through the holes in the first magnetic ring, the second magnetic ring, and the conductive ring, and the sense line electrically connected to the first and second magnetic rings;
an electrical insulator between the set line and the first magnetic ring, between the set line and the second magnetic ring, and between the set line and the conductive ring; and
at least one word line in a fourth plane parallel to the first, second, and third planes and electrically insulated from the first and second magnetic rings.

36. The device of claim 35, further comprising:
a second word line located in the fourth plane, wherein the word line and the second word line are parallel to each other and form a first word line pair;
a second pair of word lines parallel to each other and in a fifth plane parallel to the fourth plane.

37. The device of claim 36, wherein the first and second pairs of word lines are separated from each other by the first and second magnetic rings.

38. The device of claim 35, wherein the first magnetic ring, the second magnetic ring, and the conductive ring are each concentric about the set line.

39. The device of claim 35, wherein the set line and the sense line are electrically connected to each other in parallel.

40. The device of claim 35, wherein the set line and the sense line are electrically insulated from each other.

41. A device, comprising:
a first magnetic ring defining a first hole and located in a first plane;
a second magnetic ring defining a second hole and located in a second plane parallel to the first plane;
an electrical insulator ring defining a third hole, the insulator ring being oriented between the first and second magnetic rings and located in a third plane parallel to the first and second planes;
a set line through the first, second, and third holes;
an electrical insulator in the first hole and between the set line and the first magnetic ring, and in the second hole and between the set line and the second magnetic ring;
a first part of a sense line electrically connected to the first magnetic ring and electrically insulated from the set line;
a second part of the sense line electrically connected to the second magnetic ring and electrically insulated from the set line; and
at least one word line in a fourth plane parallel to the first and second planes and electrically insulated from the first and second magnetic rings.

42. The device of claim 41, further comprising:
a second word line parallel to the word line and in the fourth plane, the word line and the second word line forming a first word line pair;
a second pair of word lines parallel to each other and in a fifth plane parallel to the fourth plane, the second pair being orthogonal to the first pair of word lines.

43. A device, comprising:
first magnetic means for retaining a first circular magnetization configuration in a first plane;
second magnetic means for retaining a second circular magnetization configuration in a second plane;
means for producing a radial magnetic field in the first plane, the radial magnetic field being centered about a point in the first plane and within the first circular magnetization configuration;
means for producing a radial magnetic field in the second plane, the radial magnetic field being centered about a point in the second plane and within the second circular magnetization configuration;
means for setting the magnetization configuration in the first magnetic means without changing the magnetic configuration in the second magnetic means;
means for setting the magnetization configuration in the second magnetic means; and
means for sensing electrical resistance of the first and second magnetic means.

44. A device, comprising:
first magnetic means for retaining a first circular magnetization configuration in a first plane;
second magnetic means for retaining a second circular magnetization configuration in a second plane;
means for producing a radial magnetic field in the first plane, the radial magnetic field being centered about a point in the first plane and within the first circular magnetization configuration;
means for producing a radial magnetic field in the second plane, the radial magnetic field being centered about a point in the second plane and within the second circular magnetization configuration;
means for producing a circular magnetic field in the first and second magnetic means; and
means for sensing electrical resistance of the first and second magnetic means.

45. A device, comprising:
first magnetic means for retaining a first circular magnetization configuration;
second magnetic means for retaining a second circular magnetization configuration;
means for producing a radial magnetic field in the first plane, the radial magnetic field being centered about a point in the first plane and within the first circular magnetization configuration;
means for producing a radial magnetic field in the second plane, the radial magnetic field being centered about a point in the second plane and within the second circular magnetization configuration;
means for producing a circular magnetic field parallel to the first magnetization configuration;
means for producing a circular magnetic field anti-parallel to the first magnetization configuration; and
means for sensing electrical resistance of the first and second magnetic means.

46. A memory device, comprising:
a plurality of memory elements, each memory element including a magnetic material having a magnetization configuration that is circular in a plane; and
a plurality of bit lines, each bit line series-connecting the plurality of memory elements;
a plurality of word lines, each word line corresponding to a plurality of memory elements and each memory element having two corresponding word lines, the two corresponding word lines for collectively producing a magnetic field in the plane, the magnetic field being radial with respect to a point in the plane and within the magnetization configuration of the corresponding memory element.

47. A device, comprising:
a magnetic material having a closed-form magnetization configuration; and
a word line for producing a radial magnetic field around the magnetic material.

48. A device, comprising:
a first closed-form magnetic layer defining a first hole and located in a first plane;
a second closed-form magnetic layer defining a second hole and located in a second plane;
a bit line including a set line in the first and second holes, and a sense line electrically connected to the first and second magnetic layers;

first and second word lines in a third plane parallel to the first and second planes and electrically insulated from the first and second magnetic layers, the first and second word lines forming a first word line pair; and third and fourth word lines parallel to each other and in a fourth plane parallel to the third plane and forming a second word line pair, wherein the first and second word line pairs are orthogonal to each other.

49. A device, comprising:

a first magnetic ring defining a first hole and located in a first plane;

a second magnetic ring defining a second hole and located in a second plane;

a bit line including a set line in the first and second holes, and a sense line electrically connected to the first and second rings, wherein the set line defines an imaginary line through the first and second magnetic layers; and at least one word line in a third plane parallel to the first and second planes and electrically insulated from the first and second rings, wherein the word line includes a curved portion around the imaginary line.

50. The device of claim 49, wherein the curved portion of the word line is curved more than 180 degrees and less than 360 degrees around the imaginary line.

51. The device of claim 49, further comprising a second word line including a curved portion around the imaginary line, and wherein the word line and the second word line are separated from each other by the first and second magnetic layers.

* * * * *